(12) United States Patent
Itoh et al.

(10) Patent No.: US 6,373,110 B2
(45) Date of Patent: Apr. 16, 2002

(54) SEMICONDUCTOR DEVICE HAVING HIGH BREAKDOWN VOLTAGE

(75) Inventors: Yukio Itoh; Takao Arai, both of Tokyo (JP)

(73) Assignee: NEC Corporation, Tokyo (JP)

(*) Notice: Subject to any disclaimer, the term of this patent is extended or adjusted under 35 U.S.C. 154(b) by 0 days.

(21) Appl. No.: 09/789,672

(22) Filed: Feb. 21, 2001

(30) Foreign Application Priority Data

Feb. 23, 2000 (JP) ......................... 2000-046507

(51) Int. Cl.[7] .............................. H01L 29/72
(52) U.S. Cl. .................. 257/401; 257/322; 257/335; 257/341; 257/367; 257/496
(58) Field of Search ................... 257/322, 335, 257/341, 367, 401, 496

(56) References Cited

U.S. PATENT DOCUMENTS 6,069,386 A * 5/2000 Jos .............................. 257/335

* cited by examiner

*Primary Examiner*—Edward Wojciechowicz
(74) *Attorney, Agent, or Firm*—Hutchins, Wheeler & Dittmar

(57) ABSTRACT

A power field effect transistor includes a bulge portion and/or a constricted portion in at least one of the heavily doped drain contact region and the lightly doped channel forming region, and heavily doped source regions are formed in the lightly doped channel forming region at intervals, wherein the avalanche breakdown takes place at the bulge portion and/or the constricted portion due to the concentration of electric field in the presence of excess voltage applied to the heavily doped drain contact region, and the breakdown current flows through the gaps between the heavily doped source regions so that a emitter-base junction of a parasitic bipolar transistor is not strongly biased.

25 Claims, 19 Drawing Sheets

SEMICONDUCTOR DEVICE HAVING HIGH BREAKDOWN VOLTAGE

FIELD OF THE INVENTION

This invention relates to a semiconductor device and, more particularly, to a semiconductor device with a high beak-down power semiconductor device.

DESCRIPTION OF THE RELATED ART

A lateral DMOS field effect transistor, which has a drain electrode on the surface of a semiconductor substrate, is abbreviated as "LDMOS" transistor. The other surface area of the same p-type semiconductor substrate is available for other circuit components such as other kinds of semiconductor device or other LDMOS transistor electrically isolated from the LDMOS transistor. For this reason, the LDMOS transistor is popular to the semiconductor manufacturers as an output transistor of a power semiconductor integrated circuit device.

FIGS. 1A and 1B illustrate the prior art n-channel type LDMOS transistor. Reference numeral 301 designates a p-type silicon substrate. A lightly doped n-type impurity region 302 is grown on the major surface of the p-type silicon substrate 301. A field oxide layer 303 is selectively grown on the upper surface of the lightly doped n-type impurity region 302. A gate oxide layer 304 is further grown on the upper surface of the lightly doped n-type impurity region 302, and is contiguous to the field oxide layer 303. A gate electrode 305 is patterned on the gate oxide layer 304 and the field oxide layer 303. In other words, the gate electrode 305 is partially on the gate oxide layer 304 and partially on the field oxide layer 303. The field oxide layer 303 is patterned in such a manner that the lightly doped n-type impurity region 302 is exposed to a gap formed therein.

A p-type impurity region 306 is formed in the lightly doped n-type impurity region 302, and is located on both sides of the gap. The side surfaces of the gate electrode 305 on the gate oxide layer 304 are aligned with the p-n junction between the lightly doped n-type impurity region 302 and the p-type impurity region 306. The lightly doped n-type impurity region 302 penetrates into the lightly doped n-type impurity region 302 under the end portions of the gate electrode 305. A heavily doped p-type impurity region 311 is nested in the p-type impurity region 306, and a heavily doped n-type impurity region 312 is further formed in the p-type impurity region 306. The heavily doped n-type impurity region 312 and the heavily doped p-type impurity region 311 form a p-n junction in the p-type impurity region 306. A heavily doped n-type impurity region 313 is formed in the lightly doped n-type impurity region 302 in such a manner as to be exposed to the gap formed in the field oxide layer 303.

The lightly doped n-type impurity region 302, the p-type impurity region 306, the heavily doped n-type impurity region 312 and the heavily doped n-type impurity region 313 respectively serve as a drain region, a channel forming region, a source region and a drain contact region, which form parts of the prior art n-channel type LDMOS transistor.

The heavily doped n-type source region 312 is equal in depth to the heavily doped n-type drain contact region 313. The heavily doped p-type impurity region 311 is deeper than the heavily doped n-type source region 312, and is shallower than the lightly doped p-type channel forming region 306. The p-n junction between the p-type channel forming region 306 and the lightly doped n-type drain region 302 is shallower than the p-n junction between the lightly doped n-type drain region 302 and the p-type substrate 301. The field oxide layer 303 enhances the breakdown voltage of the drain region.

The heavily doped p-type impurity region 311 has a comb-like configuration, and the heavily doped n-type drain contact region 313 also has a comb-like configuration. The gate electrode 305 and the heavily doped n-type source region 312 are wound between the heavily doped p-type comb-like impurity region 311 and the heavily doped n-type comb-like drain contact region 313.

The prior art n-channel type LDMOS transistor is covered with an inter-layered insulating layer 321, and a source contact hole 323 and a drain contact hole 324 are formed in the inter-layered insulating layer 321. The heavily doped n-type source region 312 and the heavily doped p-type impurity region 311 are exposed to the source contact hole 323, and the heavily doped n-type drain contact region 313 is exposed to the drain contact hole 324. A source electrode 325 is formed on the inter-layered insulating layer 321, and passes through the source contact hole 323. The source electrode 325 is held in contact with the heavily doped n-type source region 312 and the heavily doped p-type impurity region 311. A drain electrode 326 is further patterned on the inter-layered insulating layer 321, and passes through the drain contact hole 324. The drain electrode 326 is held in contact with the heavily doped n-type drain contact region 313.

A problem is encountered in the prior art n-channel type LDMOS transistor in that a hot spot takes place. The hot spot is causative of serious damage to the prior art n-channel type LDMOS transistor. In detail, the heavily doped n-type source region 312 and the p-type impurity regions 306/311 form the p-n junction, and the p-type impurity region 306 and the lightly doped n-type drain region 302 form another p-n junction. These p-n junctions serve as an emitter-base junction and a base-collector junction, and the heavily doped n-type source region 312, the p-type impurity regions 306/311 and the lightly doped n-type drain region 302 behave as an emitter, a base and a collector of a parasitic n-p-n bipolar transistor. When excess voltage is applied to the drain electrode 326 due to surge or an inductance-load turn-off, strong electric field is produced in the depletion layer developed on both sides of the reversely biased p-n junction. Then, the avalanche break-down phenomenon takes place, and bread-down current Ibd flows. Moreover, the carriers flow out from the depletion layer around the reversely biased p-n junction as displacement current Idis. The total current Ibd and Idis passes through the surface of the lightly doped n-type drain region 302 and the p-type channel forming region 306, and flows into the source electrode 325. While the total current Ibd and Idis is flowing through the p-type channel forming region 306 against the resistance Rb, the potential level Vb in the p-type channel forming region 306 becomes higher than the potential level in the heavily doped n-type source region 312 by $dVb=(Ibd+Idis) \times Rb$. Then, the p-n junction between the heavily doped n-type source region 312 and the p-type channel forming region 306 is forwardly biased, and the total current Ibd and Idis serves as base current in the parasitic n-p-n bipolar transistor. The parasitic n-p-n bipolar transistor turns on, and a large amount of collector current flows in the parasitic bipolar transistor. The collector current gives rise to increase of temperature. This results in reduction of the resistance, and the reduction of the resistance gives rise to further increase of the temperature. Thus, the parasitic n-p-n bipolar transistor is increased in temperature due to the positive feedback between the increase of the temperature and the reduction of the resistance. All the current is locally concentrated to the current path of the parasitic n-p-n bipolar transistor, and the hot spot takes place in the prior art n-channel type LDMOS transistor. Current due to the avalanche break-down is also locally concentrated, and gives rise to increase of the temperature.

The current path for the total current Ibd and Idis takes place in the p-type channel forming region 306 immediately under the heavily doped n-type source region 312. The p-type dopant impurity concentration in the current path is much lower than that of the remaining p-type channel forming region 306, because the p-type dopant impurity is compensated by the n-type dopant impurity in the heat treatment after introduction of the n-type dopant impurity for the heavily doped n-type source region 312. In other words, the dopant concentration in the current path is extremely low, and, accordingly, the resistance Rb is large in value. The larger the resistance Rb, the larger the increment of the potential level. Thus, the parasitic n-p-n bipolar transistor is liable to turn on, and the prior art n-channel type LDMOS transistor tends to be damaged. In an actual LDMOS transistor, the bipolar function locally takes place, and the LDMOS transistor is immediately damaged due to the rapid temperature rise before the positive feedback.

SUMMARY OF THE INVENTION

It is therefore an important object of the present invention to provide an LDMOS transistor, which is hardly damaged.

To accomplish the object, the present invention proposes to offer passages for breakdown current generated at a predetermined portion.

In accordance with one aspect of the present invention, there is provided a semiconductor device comprising a field effect transistor fabricated on a substrate, and the field effect transistor includes a drain layer formed on the substrate and doped with a first dopant impurity for imparting a first conductivity type thereto, a gate insulating layer formed on a first surface portion of the drain layer, a gate electrode formed on the gate insulating layer and having at least one gate portion elongated in a first direction, a drain contact region doped with the first dopant impurity heavier than the drain layer for imparting the first conductivity type thereto and having at least one drain contact sub-region formed in a second surface portion of the drain layer contiguous to one side of the first surface portion and elongated in the first direction, a channel forming region doped with a second dopant impurity for imparting a second conductivity type opposite to the first conductivity type thereto and formed in a third surface portion of the drain layer contiguous to the other side of the first surface portion and elongated in the first direction, an impurity region formed in the channel forming region and doped with the second dopant impurity heavier than the channel forming region, plural source regions doped with the first dopant impurity, formed in the channel forming region between the impurity region and the first surface portion in a self-aligned manner with the gate electrode and spaced from one another in the first direction, a drain electrode held in contact with the drain contact region and a source electrode held in contact with the plural source regions and the impurity region, wherein at least one of the drain contact region and the channel forming region has a deformed portion directed to the gap between the plural source regions, and the distance between the drain contact region and the channel forming region is measured in a second direction perpendicular to the first direction so as to be different between the deformed portion and a remaining portion of aforesaid at least one of the drain contact region and the channel forming region.

BRIEF DESCRIPTION OF THE DRAWINGS

The features and advantages of the semiconductor device will be more clearly understood from the following description taken in conjunction with the accompanying drawings in which.

DESCRIPTION OF THE PREFERRED EMBODIMENTS

First Embodiment

Figure 2A:
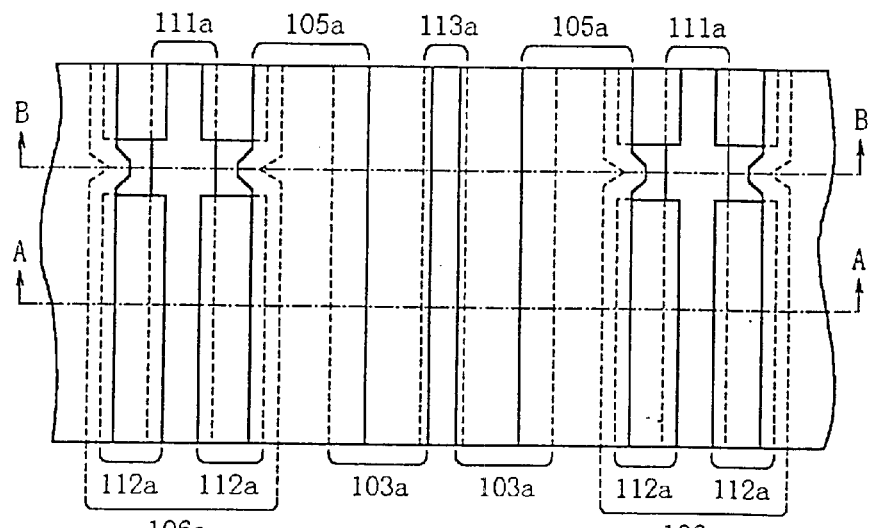
FIG. 2A is a plane view showing a power field effect transistor incorporated in a semiconductor device according to the present invention.
Figure 2B:
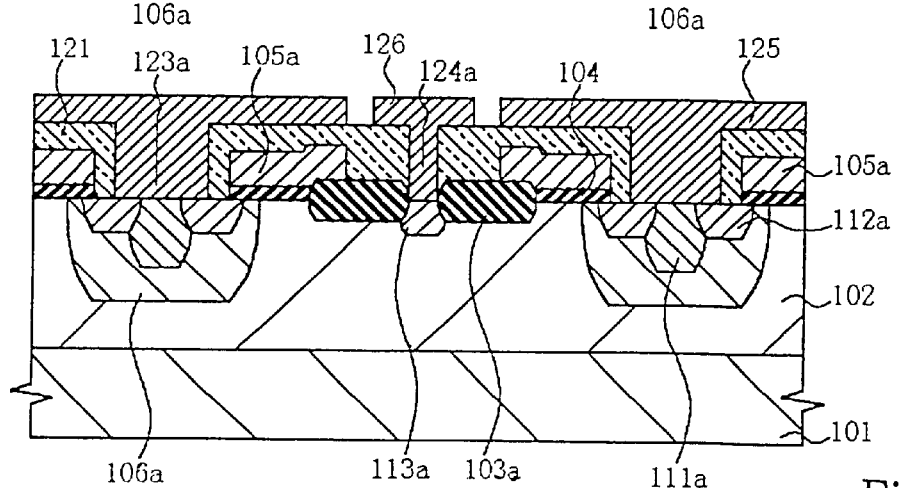
FIG. 2B is a cross sectional view taken along line A—A of FIG. 2A, and showing the structure of the power field effect transistor exposed to the cross section.
Figure 2C:
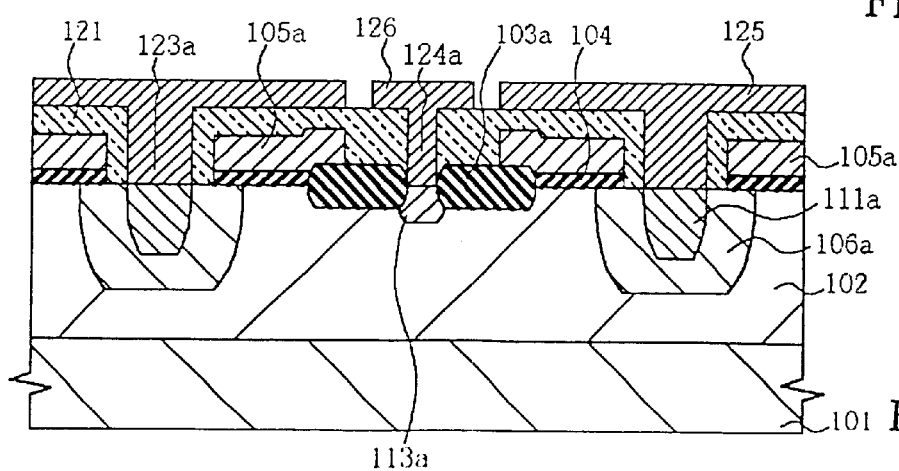
FIG. 2C is a cross sectional view taken along line B—B of FIG. 2A and showing the structure of the power field effect transistor exposed to the cross section.

Referring to FIGS. 2A, 2B and 2C of the drawings, a power field effect transistor is incorporated in a semiconductor device embodying the present invention. The power field effect transistor is categorized in the LDMOS transistor.

The power field effect transistor is fabricated on a p-type silicon substrate 101. The resistivity of the p-type silicon substrate 101 is of the order of 13.5 ohm-cm. The major surface of the p-type silicon substrate 101 is covered with a lightly doped n-type impurity region 102, and the lightly doped n-type impurity region 102 forms a p-n junction together with the p-type silicon substrate 101. The p-n junction between the p-type silicon substrate 101 and the lightly doped n-type impurity region 102 is of the order of 6 microns deep from the upper surface of the lightly doped n-type impurity region 102.

A field oxide layer 103a is grown in a surface portion of the lightly doped n-type impurity region 102 through a selective oxidation technique, and is of the order of 470 nanometers thick. The field oxide layer 103a is patterned in such a manner that a part of the lightly doped n-type impurity region 102 is exposed to a gap formed therein. The field oxide layer 103a is of the order of 3.0 microns wide.

Silicon oxide is thermally grown in another surface portion of the lightly doped n-type impurity region 102, and forms a gate oxide layer 104. The gate oxide layer 104 is of the order to 50 nanometers thick, and is contiguous to the field oxide layer 103a.

A gate electrode 105a is formed of heavily doped n-type polysilicon, and is of the order of 450 nanometers thick. The gate electrode 105a lies in a zigzag line, and, accordingly, has generally straight gate portions (see FIG. 2A) and folded portions between the gate portions. The gate portions of the gate electrode 105a are partially on the field oxide layer 103a and partially on the gate oxide layer 104. In other words, the gate portions of the gate electrode 105a are provided over the lightly doped n-type impurity region 102 partially through the gate oxide layer 104 and partially through the field oxide layer 103a. The field oxide layer 103a enhances the drain-and-gate breakdown voltage of the power field effect transistor.

The gate portions of the gate electrode 105a locally bulge out, and, accordingly, have respective straight portions and respective projecting portions. The gate portions are cut along line A—A, and the cross sections of the straight portions are shown in FIG. 2B. The gate portions are further cut along line B—B, and the cross sections of the projecting portions are shown in FIG. 2C. The field oxide layer 103a is overlapped with the gate electrode 105a as described hereinbefore, and the overlap portions are constant in width along the overall length of the gate portions. In this instance, the overlap portions are of the order of 1.0 micron wide. The non-overlap portions of the gate portions 105a are respectively located on the gate oxide layer 104. The projecting portions have the non-overlap portions, which are wider than the non-overlap portions of the straight portions. In this instance, the straight portions are as wide as 2.5 microns, and the difference of the non-overlap portions between the straight portions and the projecting portions is of the order of 0.7 micron. The projecting portions have the trapezoidal plane figure on either side thereof (see FIG. 2A). The trapezoidal projecting portion has a surface, which is in parallel to the side surfaces of the straight portion, and the surface is of the order of 1 micron long. The surface is connected through oblique surfaces to the side surface of the associated straight portion, and the base angle at each corner is 45 degrees.

In a surface portion of the lightly doped n-type impurity region 102 is formed a p-type impurity region 106a which forms a p-n junction together with the lightly doped n-type impurity region 102. The p-n junction between the p-type impurity region 106a and the lightly doped n-type impurity region 102 is of the order of 1.5 microns deep, and is exposed to the upper surface of the lightly doped n-type impurity region 102 under the gate oxide layers 104. The p-type impurity region 106a is locally constricted due to the trapezoidal projecting portions. The constricted portions of the p-type impurity region 106a have a triangular plane figure as shown in FIG. 2A.

As described hereinbefore, the gap is formed in the field oxide layer 103a. A heavily doped n-type impurity region 113a is formed in a surface portion of the lightly doped n-type impurity region 102 in a self-aligned manner with the field oxide layer 103a, and is spaced from the p-type impurity region 106a. The heavily doped n-type impurity region 113a has a comb-like configuration, and one of the teeth is shown in FIGS. 2A to 2C. The heavily doped n-type impurity region 113a is of the order of 0.3 micron in depth.

A heavily doped p-type impurity region 111a is nested in the p-type impurity region 106a, and is laterally spaced from the gate electrode 105a. The heavily doped p-type impurity region 111a has a comb-like configuration, and the teeth of the comb-like heavily doped p-type impurity region 111a are interdigitated with the teeth of the heavily doped n-type impurity region 113a. The teeth of the comb-like heavily doped p-type impurity region 111a extend along the gate portions of the gate electrode 105a substantially in parallel. In other words, the gate electrode 105a extends along the gap between the teeth of the comb-like heavily doped n-type impurity region 113a and the teeth of the comb-like heavily doped p-type impurity region 111a. The heavily doped p-type impurity region 111a is of the order of 1 micron deep.

Heavily doped n-type impurity regions 112a are further formed in the p-type impurity region 106a, and are located between the heavily doped p-type impurity region 111a and the lightly doped n-type impurity region 102 under the gate electrode 105a. The heavily doped n-type impurity regions 112a are disconnected at the constricted portions of the p-type impurity region 106a, and are located along a virtual zigzag line along the gate electrode 105a. The heavily doped n-type impurity regions 112a are spaced from one another at the constricted portions of the p-type impurity region 106a, and the gap between the adjacent two heavily doped n-type impurity regions 112a is of the order of 3 microns. For this reason, the heavily doped n-type impurity regions 112a are not shown in FIG. 2C. The heavily doped n-type impurity regions 112a form p-n junctions together with the p-type impurity region 106a, and are exposed to the upper surface of the p-type impurity region 106a in such a manner as to be substantially aligned with the gate electrode 105a. The p-n junctions between the heavily doped n-type impurity regions 112a and the p-type impurity region 106a downwardly penetrate from the upper surface of the p-type impurity region 106a, and reach the depth of the order of 0.3 micron. Thus, the heavily doped n-type impurity regions 112a are as deep as the heavily doped n-type impurity region 113a.

The heavily doped n-type impurity region 113a serves as a drain contact region, and the lightly doped n-type impurity region 102 between the heavily doped n-type impurity region 113a and the p-type impurity region 106a, the heavily doped n-type impurity regions 112a and the p-type impurity region 106a respectively serve as a drain, a source and a channel forming region of the power field effect transistor. The channel length of the power field effect transistor is of the order of 1.0 micron. The gate portions are arranged at intervals of about 4.0 microns, and the heavily doped n-type source regions 112a are spaced by about 1.0 micron between the adjacent two gate portions.

The power field effect transistor according to the present invention includes the comb-like heavily doped n-type drain contact region 113a interdigitated with the comb-like heavily doped p-type impurity region 111a. The gate electrode 105a lies in the zigzag line between the teeth of the comb-like heavily doped n-type drain contact region 113a and the teeth of the comb-like heavily doped p-type impurity region 111a, and the heavily doped n-type source regions 112a are arranged on the virtual zigzag line between the gate electrode 105a and the heavily doped p-type impurity region 111a.

The power field effect transistor is covered with an inter-layered insulating layer 121, and source contact holes 123a and drain contact holes 124a are formed in the inter-layered insulating layer 121. The heavily doped n-type drain contact region 113a is exposed to the drain contact holes 124a, and the heavily doped n-type source regions 112a and the heavily doped p-type impurity region 111a are exposed to the source contact holes 123a. A source electrode 125 and a drain electrode 126 are patterned on the inter-layered insulating layer 121. The source electrode 125 penetrates through the source contact holes 123a, and is held in contact with the heavily doped n-type source regions 112a and the heavily doped p-type impurity region 111a. On the other hand, the drain electrode 126 penetrates through the drain contact holes 124a, and is held in contact with the heavily doped n-type drain contact region 113a.

Figure 3A:
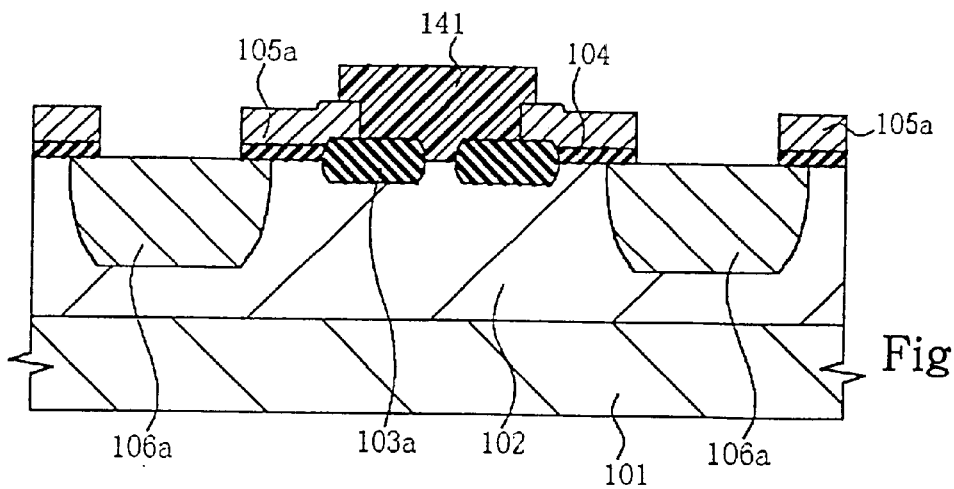
FIGS. 3A to 3C are cross sectional view taken along line A—A of FIG. 2A and showing a process for fabricating the power field effect transistor.
Figure 3B:
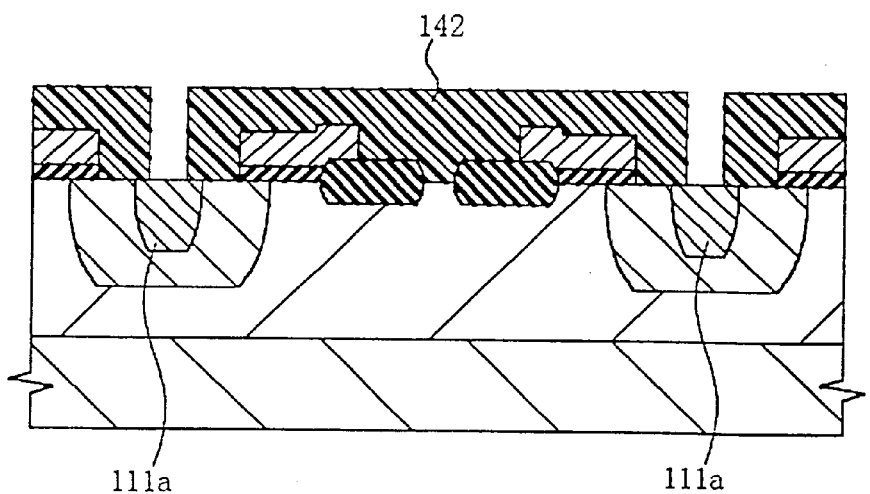
Figure 3C:
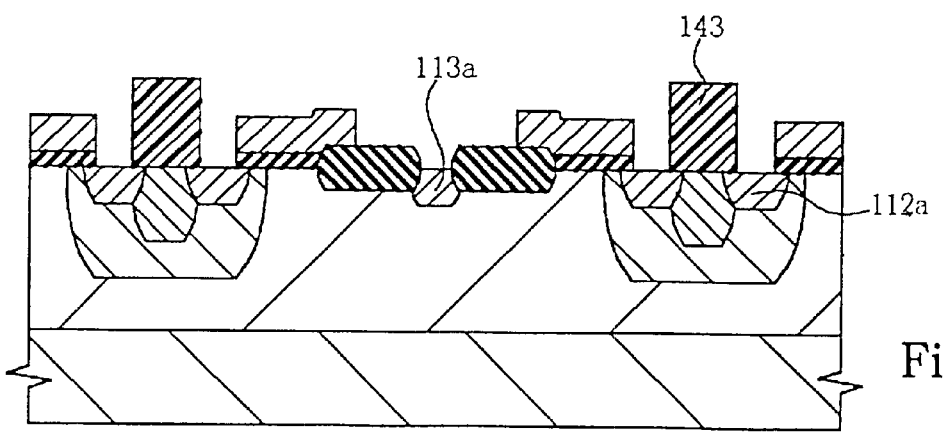
Figure 4A:
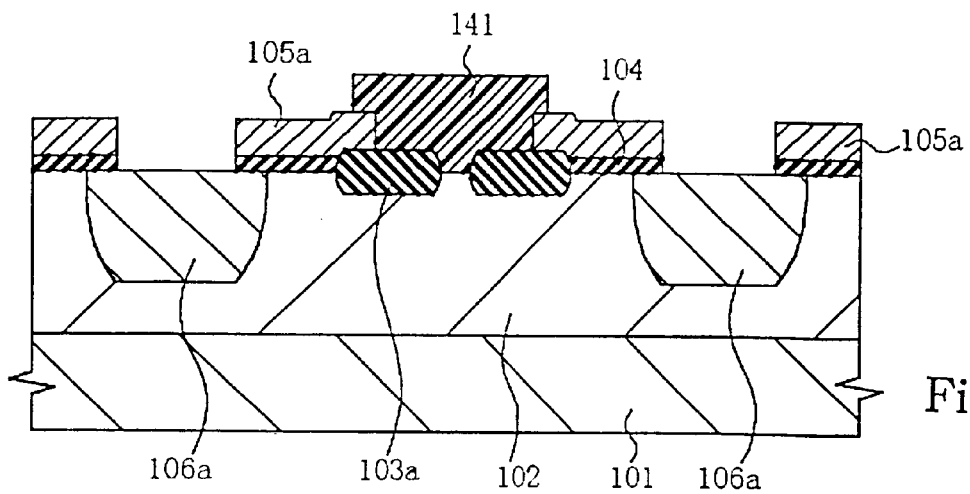
FIGS. 4A to 4C are cross sectional views taken along line B—B of FIG. 2A and showing the process.
Figure 4B:
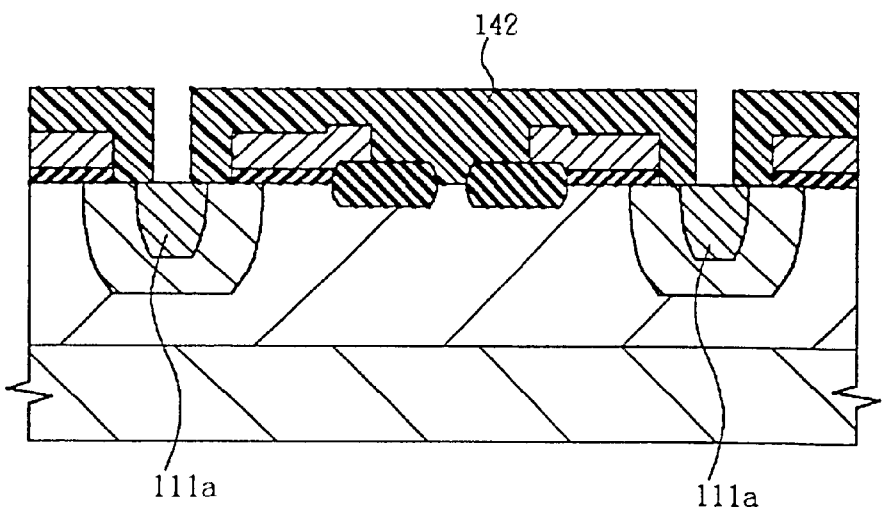
Figure 4C:
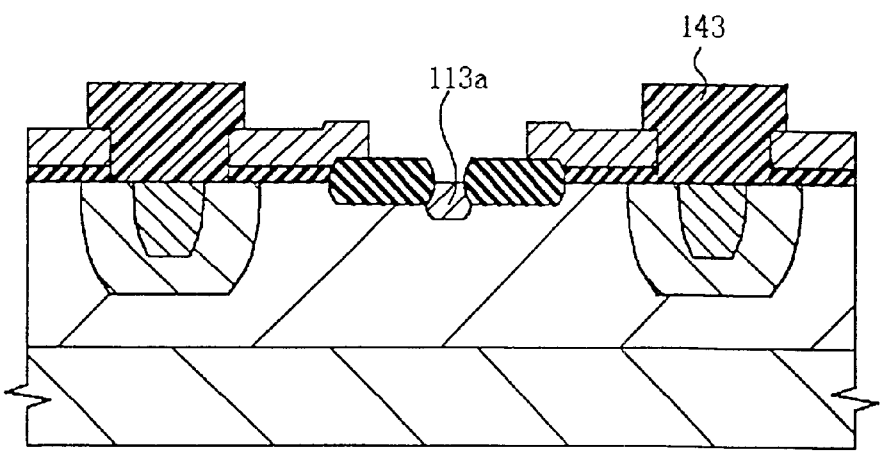

The power field effect transistor is fabricated through a process sequence as follows. FIGS. 3A to 3C show the cross section taken along line A—A of FIG. 2A at different steps of the fabrication process, and FIGS. 4A to 4C show the cross section taken along line B—B of FIG. 2A at the different steps.

The process starts with preparation of the p-type silicon substrate 101. A major surface of the p-type silicon substrate 101 is assigned to the power field effect transistor. Phosphorus is ion implanted into the surface portion of the p-type silicon substrate 101 at dosage of $2.5 \times 10^{12}$ cm$^{-2}$ at 150 KeV. After the ion-implantation, the phosphorous is activated at 1200 degrees in centigrade for 8 hours. Then, the phosphorous forms the lightly doped n-type drain region 102, and the p-n junction between the p-type silicon substrate 101 and the lightly doped n-type drain region 102 is as deep as 6 microns.

The silicon oxide is grown to 470 nanometers thick on the surface portion of the lightly doped n-type drain region 102 through a selective oxidation technique, and forms the field oxide layer 103a. The field oxide layer 103a penetrates into the surface portion of the lightly doped n-type drain region 102 assigned to the overlap portions of the gate electrode 105a. Using the field oxide layer 103a as a mask, the lightly doped n-type drain region 102 is thermally oxidized. The silicon oxide is grown to 50 nanometers thick on the lightly doped n-type drain region 102, and forms a silicon oxide layer.

Subsequently, heavily doped n-type polysilicon is deposited to 450 nanometers thick over the entire surface of the resultant structure. An etching mask (not shown) is prepared on the heavily doped n-type polysilicon layer through photo-lightographic techniques, and the heavily doped n-type polysilicon layer and the silicon oxide layer are selectively removed from the resultant structure. The gate electrode 105a is left on the gate oxide layer 104, and has the straight portions and the projecting portions. As described hereinbefore, the straight portions are 2.5 microns wide, and the gate portions lie on the field oxide layer 103a by 1 micron. The projecting portions are wider than the straight portions by 0.7 micron, and have the trapezoidal projections on either side thereof. The trapezoidal projection has the outermost side surface of 1 micron long. The base angle is 45 degrees.

Subsequently, a photo-resist ion-implantation mask 141 is prepared on the resultant structure. The photo-resist ion-implantation mask 141 has an opening to which an upper surface of the lightly doped n-type drain region 102 assigned to the p-type impurity region 106a is exposed. However, another upper surface of the lightly doped n-type impurity region 102 assigned to the heavily doped n-type drain contact region 113a is covered with the photo-resist ion-implantation mask 141.

Using the photo-resist ion-implantation mask 141 and the gate electrode 105a as a mask, boron is ion implanted into the lightly doped n-type drain region 102 at dosage of $5 \times 10^{13}$ cm$^{-2}$ at acceleration energy of 70 KeV in a self-aligned manner with the gate electrode 105a. The photo-resist ion-implantation mask 141 is stripped off, and the boron is activated at 1140 degrees in centigrade for 25 minutes. The boron forms the p-type impurity region 106a, and the p-type impurity region 106a and the lightly doped n-type drain region 102 form the p-n junction at 1.5 microns deep. The p-type impurity region 106a has the constricted portions due to the trapezoidal projections. The resultant structure is shown in FIGS. 3A and 4A.

Another photo-resist ion-implantation mask 142 is prepared on the resultant structure by using the photo-lithographic techniques, and has an opening over a surface of the p-type impurity region 106a. However, the photo-resist ion-implantation mask 142 lies on the remaining surface of the p-type impurity region 106a and the surface of the lightly doped n-type drain region 102 assigned to the heavily doped n-type drain contact region 113a. The opening of the photo-resist ion-implantation mask 142 is less than 2.6 microns wide, but is equal to or greater than 0.6 micron wide. Boron is ion implanted into the surface portion of the p-type impurity region 106a at dosage of $4 \times 10^{15}$ cm$^{-2}$ at acceleration energy of 50 KeV. The photo-resist ion-implantation mask 142 is stripped off, and the boron is activated at 1000 degrees in centigrade for 30 minutes. The boron forms the heavily doped p-type impurity region 111a, and the heavily doped p-type impurity region 111a is nested in the p-type impurity region 106a. The heavily doped p-type impurity region 111a is spaced from the gate portions of the gate electrode 105a. The resultant structure is shown in FIGS. 3B and 4B.

Yet another photo-resist ion-implantation mask 143 is prepared on the resultant structure by using the photo-lithographic techniques. The photo-resist ion-implantation mask 143 lies on the p-type impurity region. However, the photo-resist ion-implantation mask 143 has at least two openings. The surface assigned to the heavily doped n-type drain contact region 113a is exposed to one of the at least two openings, and surfaces of the p-type impurity region 106a assigned to the heavily doped n-type source regions 112a are exposed to the other opening. The heavily doped n-type source regions 112a are disconnected at the constricted portions of the p-type impurity regions 106a as described hereinbefore, and, accordingly, the constricted portions are covered with the photo-resist ion implantation mask 143 (see FIG. 4C). The photo-resist ion-implantation mask 143 on the heavily doped p-type impurity region 111a is of the order of 1.2 microns wide, and is spaced from the side surface of the gate portions by 1.4 microns. The constricted portions covered with the photo-resist ion-implantation mask 143 are of the order of 4.2 microns wide.

Using the photo-resist ion-implantation mask 143, the field oxide layer 103a and the gate electrode 105a as a mask, arsenic is ion implanted into the exposed surface portions at dosage of $1 \times 10^{16}$ cm$^{-2}$ at acceleration energy of 70 KeV. The photo-resist ion-implantation mask 143 is stripped off, and the arsenic is activated through a heat treatment. The arsenic forms the heavily doped n-type drain contact region 113a and the heavily doped n-type source regions 112a, and the heavily doped n-type drain contact region 113a and the heavily doped n-type source regions 112a have the bottom surfaces which are of the order of 0.3 micron deep. The resultant structure is shown in FIGS. 3C and 4C.

Subsequently, insulating material is deposited over the entire surface of the resultant structure, and forms the inter-layered insulating layer 121. A photo-resist etching mask (not shown) is patterned on the inter-layered insulating layer 121 by using the photo-lithographic techniques, and has openings over the heavily doped n-type drain contact region 113a and the heavily doped n-type source regions 112a. The inter-layered insulating layer 121 is selectively etched so that the source contact holes 123a and the drain contact holes 124a are formed therein. The photo-resist etching mask is stripped off.

Conductive material is deposited over the entire surface of the resultant structure, and a photo-resist ion-implantation mask (not shown) is formed on the conductive material layer. The conductive material layer is selectively etched so that the source electrode 125 and the drain electrode 126 lie on the inter-layered insulating layer 121.

As described hereinbefore, the constricted portions are formed in the p-type impurity region 106a due to the trapezoidal projections of the gate electrode 105a, and the ion-implantation through the photo-resist mask 143 causes the heavily doped n-type source regions 112a to be separated from one another by the constricted portions. Although the p-type impurity region 106a is extremely large in resistance immediately under the heavily doped n-type source regions 112a, the heavily doped n-type source regions 112a are spaced from one another in the constricted portions of the p-type impurity region 106a, and conductive current paths are formed between the heavily doped n-type source regions 112a. The conductive current paths are much smaller in resistance from the p-type impurity region immediately under the heavily doped n-type source regions 112a.

When excess voltage is applied to the drain electrode 126 due to the surge or inductance-load turn-off, by way of example, strong electric field is generated in the depletion layer on both sides of the reversely biased p-n junction, and electron avalanche break-down takes place. The electrons flow as breakdown current. The constricted portions have a large curvature, and the electric field is made strong. For this reason, the break-down current is concentrated at the constricted portions, and flows into the conductive current paths in the constricted portions. The break-down current flows through the conductive current paths without serious resistance, and the potential level in the p-type impurity region 106a is less increased. Although the power field effect transistor unavoidably includes the parasitic bipolar transistor as similar to the prior art power field effect transistor, the base-emitter junction of the parasitic bipolar transistor is not strongly biased with the potential level in the p-type impurity region 106a, and the parasitic bipolar transistor is less liable to turn on. The potential level in the constricted portions tends to be high due to the concentrated break-down current. However, there is not any heavily doped n-type impurity region in the constricted portions of the p-type impurity region 106a. For this reason, the potential level in the constricted portions does not result in the undesirable turn-on of the parasitic bipolar transistor.

As will be understood from the foregoing description, the constricted portions between the heavily doped n-type source regions 112a prevent the emitter-base junction of the parasitic bipolar transistor from the serious forward bias voltage. The parasitic bipolar transistor hardly turns on, and the power field effect transistor implementing the first embodiment is less damaged.

Even though the parasitic bipolar transistor does not turn on, the power field effect transistor consumes a large amount of electric power at the avalanche break-down, and the large amount of electric consumption is causative of undesirable increase of temperature. The constricted portions are uniformly distributed over the power field effect transistor. For this reason, the power field effect transistor is not locally increased in temperature, and this is conducive to the withstanding capability of the power field effect transistor.

Figure 1A:
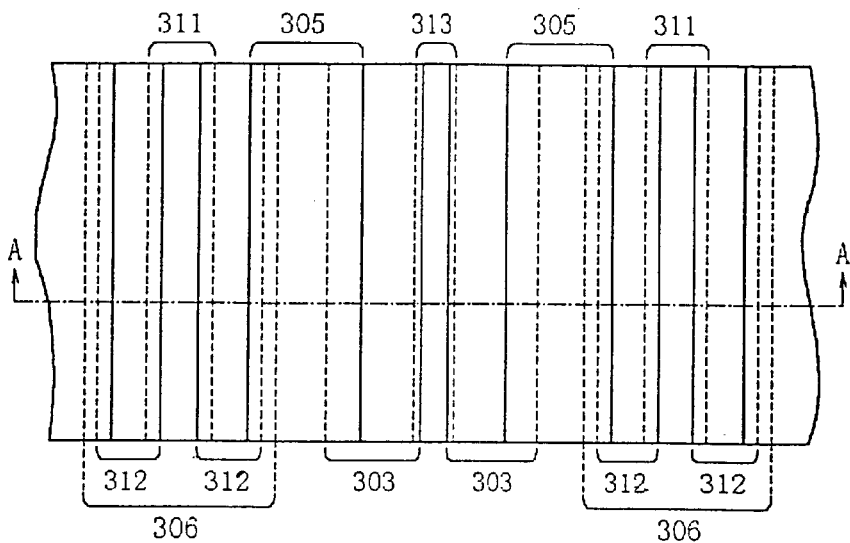
FIG. 1A is a plane view showing the prior art power semiconductor device.
Figure 1B:
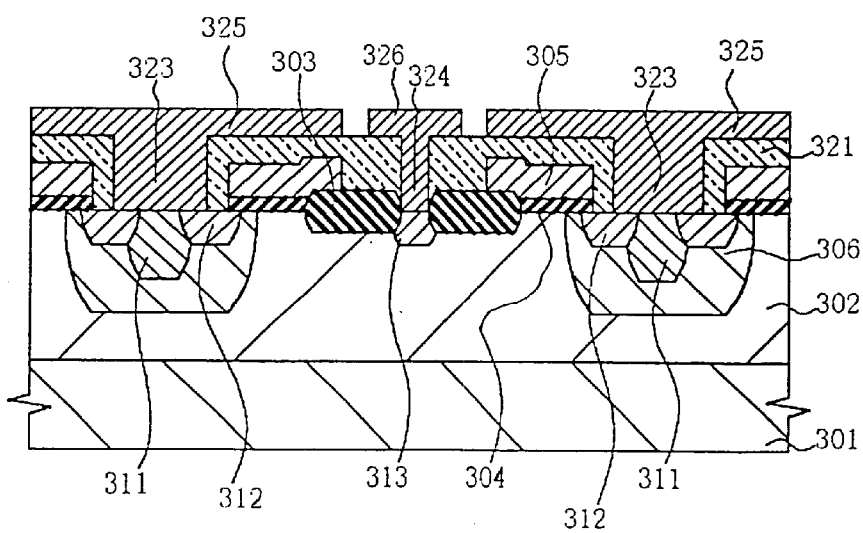
FIG. 1B is a cross sectional view taken along line A—A of FIG. 1A and showing the structure of the prior art power semiconductor device.

The present inventors investigated the power field effect transistor implementing the first embodiment. The present inventors fabricated a sample EX.1 of the power field effect transistor implementing the first embodiment and a sample P.A. of the prior art power field effect transistor shown in FIGS. 1A and 1B. The process parameters were same between the sample EX.1 of the power field effect transistor implementing the first embodiment and the sample P.A. of the prior art power field effect transistor except the formation of the constricted portions. The occupation area for the samples was 0.24 square millimeter.

Figure 5A:
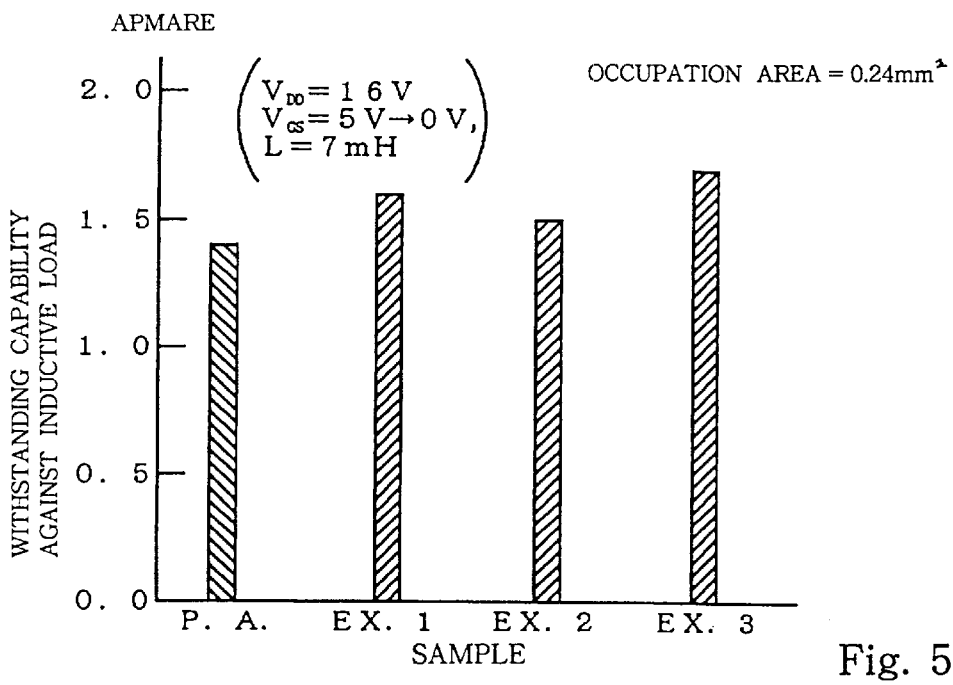
FIGS. 5A and 5B are graphs showing withstanding capability of the power field effect transistor in comparison with the prior art power field effect transistor.
Figure 5B:
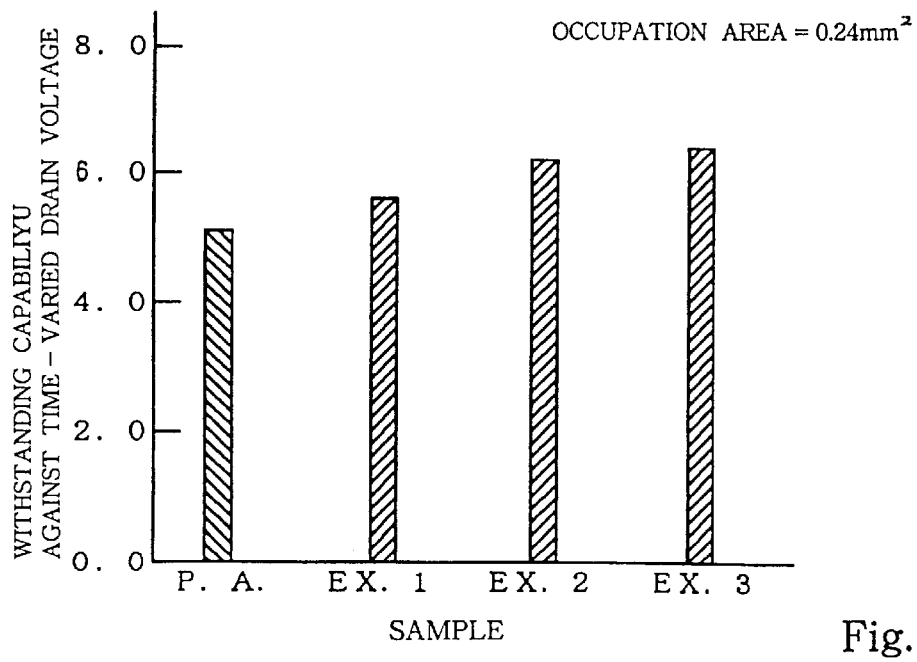

The samples EX.1 and P.A. were connected to the power voltage of 16 volts and the inductive load of 7 mH. The gate voltage was changed from 5 volts to zero. The present inventors measured the withstanding capability of the samples EX.1 and P.A., and plotted the experimental result in FIGS. 5A and 5B. The withstanding capability against the inductive load was improved at 14 percent, and the withstanding capability against the time-varied drain voltage dV/dt was improved at 10 percent.

Second Embodiment

Figure 6A:
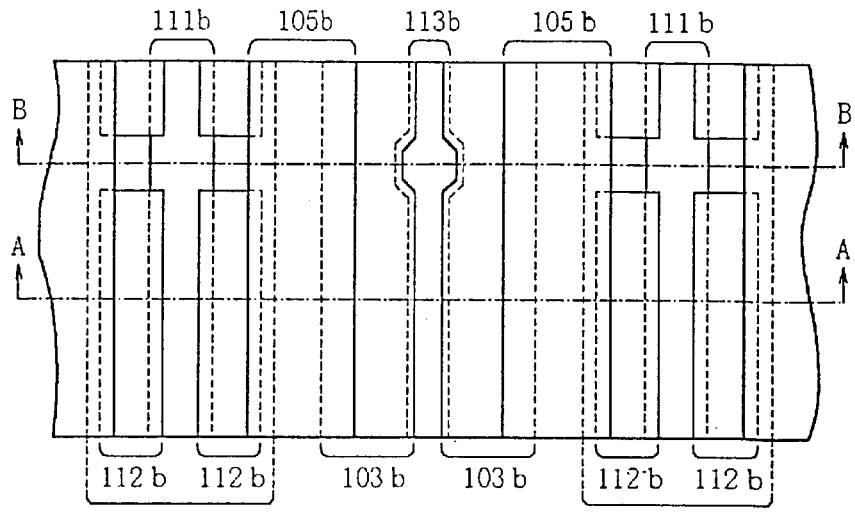
FIG. 6A is a plane view showing another power field effect transistor incorporated in a semiconductor device according to the present invention.
Figure 6B:
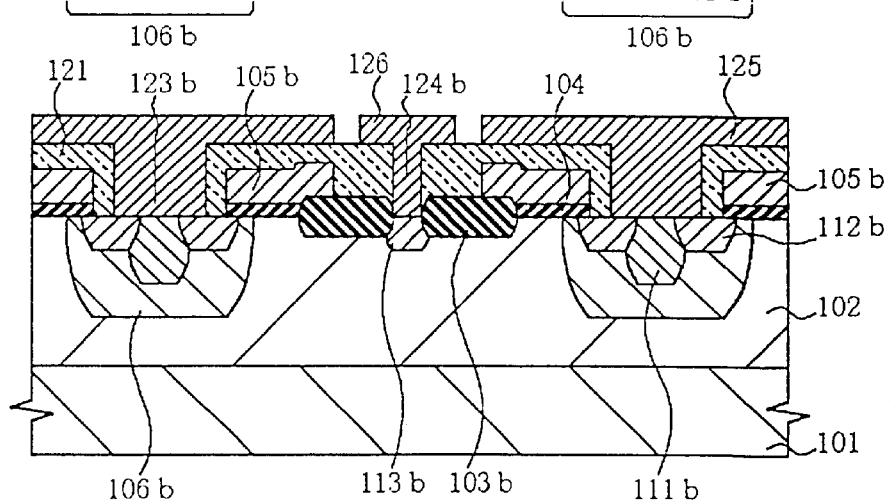
FIG. 6B is a cross sectional view taken along line A—A of FIG. 6A, and showing the structure of the power field effect transistor exposed to the cross section.
Figure 6C:
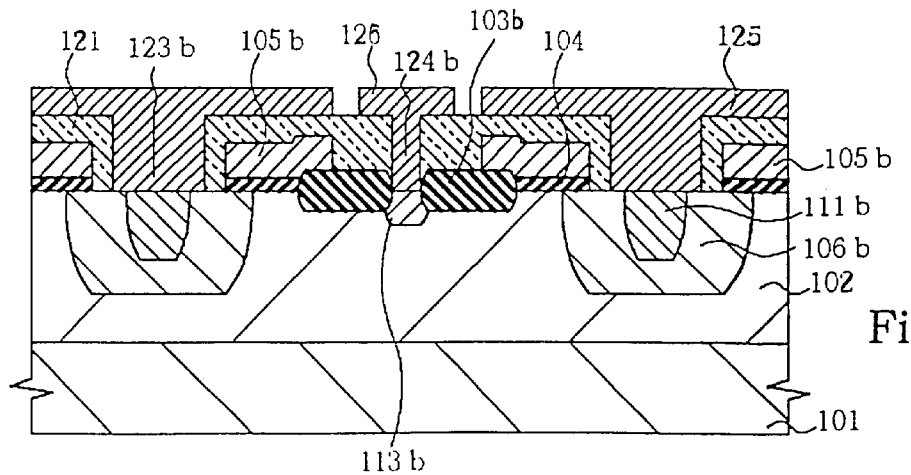
FIG. 6C is a cross sectional view taken along line B—B of FIG. 6A and showing the structure of the power field effect transistor exposed to the cross section.

Turning to FIGS. 6A to 6C of the drawings, another power field effect transistor is fabricated on a p-type silicon substrate 101. The power field effect transistor implementing the second embodiment is also categorized in the LDMOS transistor. The power field effect transistor shown in FIGS. 6A to 6C differs from the power field effect transistor shown in FIGS. 2A to 2C in that a field oxide layer 113$b$ has constricted portions.

A lightly doped n-type impurity region 102 is laminated on the major surface of the p-type silicon substrate 101, and the lightly doped n-type impurity region 102 forms a p-n junction together with the p-type silicon substrate 101. The p-n junction between the p-type silicon substrate 101 and the lightly doped n-type impurity region 102 is of the order of 6 microns deep from the upper surface of the lightly doped n-type impurity region 102.

The field oxide layer 103$b$ is grown in a surface portion of the lightly doped n-type impurity region 102 through a selective oxidation technique, and is of the order of 470 nanometers thick. The field oxide layer 103$b$ is patterned in such a manner that a part of the lightly doped n-type impurity region 102 is exposed to a gap formed therein. The field oxide layer 103$b$ is locally constricted so as to form dents. The field oxide layer 103$b$ is of the order of 3.0 microns wide except the constricted portions. The dents have a trapezoidal plane figure.

Silicon oxide is thermally grown in another surface portion of the lightly doped n-type impurity region 102, and forms a gate oxide layer 104. The gate oxide layer 104 is of the order to 50nanometers thick, and is contiguous to the field oxide layer 103$b$.

A gate electrode 105$b$ is formed of heavily doped n-type polysilicon, and is of the order of 450 nanometers thick. The gate electrode 105$b$ lies in a zigzag line, and, accordingly, has generally straight gate portions (see FIG. 6A) and folded portions between the gate portions. The gate portions of the gate electrode 105$b$ are partially on the field oxide layer 103$b$ and partially on the gate oxide layer 104. In other words, the gate portions of the gate electrode 105$b$ are provided over the lightly doped n-type impurity region 102 partially through the gate oxide layer 104 and partially through the field oxide layer 103$b$. The field oxide layer 103$b$ enhances the drain-and-gate breakdown voltage of the power field effect transistor.

The field oxide layer 103$b$ is overlapped with the gate electrode 105$b$ as described hereinbefore, and the overlap portions are constant in width along the overall length of the gate portions. In this instance, the overlap portions are of the order of 1.0 micron wide. The non-overlap portions of the field oxide layer 103$b$ are partially decreased in width due to the dents. The non-overlap portions of the constricted portions are narrower than the non-overlap portions of the remaining portions by about 0.7 micron. The constricted portion is of the order of 1.0 micron long. The constricted portion has a surface, which is in parallel to the side surfaces of the gate portions, and the surface is of the order of 1 micron long. The surface is connected through oblique surfaces to the side surface of the remaining field oxide layer 103$b$, and the base angle of the trapezoidal dent is 45 degrees.

In a surface portion of the lightly doped n-type impurity region 102 is formed a p-type impurity region 106$b$ which forms a p-n junction together with the lightly doped n-type impurity region 102. The p-n junction between the p-type impurity region 106$b$ and the lightly doped n-type impurity region 102 is exposed to the upper surface of the lightly doped n-type impurity region 102 under the gate oxide layers 104.

As described hereinbefore, the gap is formed in the field oxide layer 103$b$. A heavily doped n-type impurity region 113$b$ is formed in a surface portion of the lightly doped n-type impurity region 102 in a self-aligned manner with the field oxide layer 103$b$, and is spaced from the p-type impurity region 106$b$. The heavily doped n-type impurity region 113$b$ has a comb-like configuration, and one of the teeth is shown in FIGS. 6A to 6C. The heavily doped n-type impurity region 113$b$ is of the order of 0.3 micron in depth. The gap locally bulges out due to the dents of the field oxide layer 103$b$, and, accordingly, the heavily doped n-type impurity region 113$b$ locally bulges out.

A heavily doped p-type impurity region 111$b$ is nested in the p-type impurity region 106$b$, and is laterally spaced from the gate electrode 105$b$. The heavily doped p-type impurity region 111$b$ has a comb-like configuration, and the teeth of the comb-like heavily doped p-type impurity region 111$b$ are interdigitated with the teeth of the heavily doped n-type impurity region 113$b$. The teeth of the comb-like heavily doped p-type impurity region 111$b$ extend along the gate portions of the gate electrode 105$b$ substantially in parallel. In other words, the gate electrode 105$b$ extends along the gap between the teeth of the comb-like heavily doped n-type impurity region 113$b$ and the teeth of the comb-like heavily doped p-type impurity region 111$b$. The heavily doped p-type impurity region 111$b$ is of the order of 1 micron deep.

Heavily doped n-type impurity regions 112$b$ are further formed in the p-type impurity region 106$b$, and are located between the heavily doped p-type impurity region 111$b$ and the lightly doped n-type impurity region 102 under the gate electrode 105$b$. The heavily doped n-type impurity regions 112$b$ are disconnected at certain portions of the p-type impurity region 106$b$ opposite to the bulge portions of the heavily doped n-type impurity region 113$b$, and are located along a virtual zigzag line along the gate electrode 105$b$. The heavily doped n-type impurity regions 112$b$ are spaced from one another at the certain portions of the p-type impurity region 106$b$, and the gap between the adjacent two heavily doped n-type impurity regions 112$b$ is of the order of 3 microns. For this reason, the heavily doped n-type impurity regions 112$b$ are not shown in FIG. 6C. The heavily doped n-type impurity regions 112$b$ form p-n junctions together with the p-type impurity region 106$b$, and are exposed to the upper surface of the p-type impurity region 106$a$ in such a manner as to be substantially aligned with the gate electrode 105$b$. The p-n junctions between the heavily doped n-type impurity regions 112$b$ and the p-type impurity region 106$b$ downwardly penetrate from the upper surface of the p-type impurity region 106b, and reach the depth of the order of 0.3 micron. Thus, the heavily doped n-type impurity regions 112b are as deep as the heavily doped n-type impurity region 113b.

The heavily doped n-type impurity region 113b serves as a drain contact region, and the lightly doped n-type impurity region 102 between the heavily doped n-type impurity region 113b and the p-type impurity region 106b, the heavily doped n-type impurity regions 112b and the p-type impurity region 106b respectively serve as a drain, a source and a channel forming region of the power field effect transistor. The channel length of the power field effect transistor is of the order of 1.0 micron. The gate portions are arranged at intervals of about 4.0 microns, and the heavily doped n-type source regions 112b are spaced by about 1.0 micron between the adjacent two gate portions.

The power field effect transistor according to the present invention includes the comb-like heavily doped n-type drain contact region 113b interdigitated with the comb-like heavily doped p-type impurity region 111b. The gate electrode 105b lies in the zigzag line between the teeth of the comb-like heavily doped n-type drain contact region 113b and the teeth of the comb-like heavily doped p-type impurity region 111b, and the heavily doped n-type source regions 112b are arranged on the virtual zigzag line between the gate electrode 105b and the heavily doped p-type impurity region 111b.

The power field effect transistor is covered with an inter-layered insulating layer 121, and source contact holes 123b and drain contact holes 124b are formed in the inter-layered insulating layer 121. The heavily doped n-type drain contact region 113b is exposed to the drain contact holes 124b, and the heavily doped n-type source regions 112b and the heavily doped p-type impurity region 111b are exposed to the source contact holes 123b. A source electrode 125 and a drain electrode 126 are patterned on the inter-layered insulating layer 121. The source electrode 125 penetrates through the source contact holes 123b, and is held in contact with the heavily doped n-type source regions 112b and the heavily doped p-type impurity region 111b. On the other hand, the drain electrode 126 penetrates through the drain contact holes 124b, and is held in contact with the heavily doped n-type drain contact region 113b.

When the excess voltage is applied to the drain electrode 126, the electric field is concentrated around the bulge portions of the heavily doped n-type drain contact region 113b, and the avalanche breakdown takes place. The breakdown current flows through conductive current paths in the p-type impurity region 106b between the heavily doped n-type source regions 112b, because the conductive current paths are opposite to the bulge portions of the heavily doped n-type drain contact region 113b. Although the breakdown current raises the potential level in the p-type impurity region 106b, the potential rise is not large, because the conductive current paths are lower in resistance than the p-type impurity region 106b under the heavily doped n-type source regions 112b. For this reason, the parasitic bipolar transistor is less liable to turn on.

The present inventors investigated the power field effect transistor implementing the second embodiment. The present inventor fabricated a sample EX.2 of the power field effect transistor, and the sample EX.2 was connected to the power supply line and the inductive load as similar to the power field effect transistor implementing the first embodiment. The withstanding capability against the inductive load was improved at 7 percent with respect to the prior art power field effect transistor, and the withstanding capability against the time-varied drain voltage dV/dt was improved at 22 percent (see FIGS. 5A and 5B). Thus, the conductive current paths opposite to the bulge portions of the heavily doped n-type drain contact region 113b were further effective against the time-varied drain voltage dV/dt.

Third Embodiment

Figure 7A:
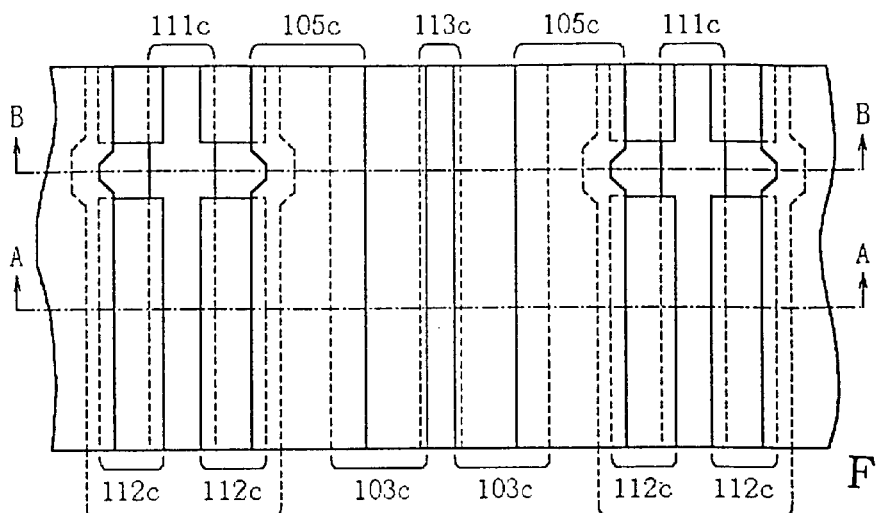
FIG. 7A is a plane view showing yet another power field effect transistor incorporated in a semiconductor device according to the present invention.
Figure 7B:
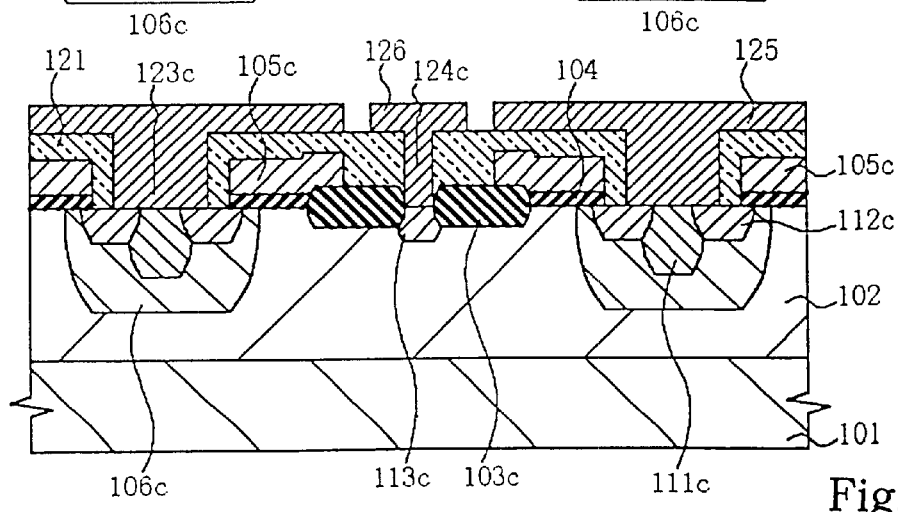
FIG. 7B is a cross sectional view taken along line A—A of FIG. 7A, and showing the structure of the power field effect transistor exposed to the cross section.
Figure 7C:
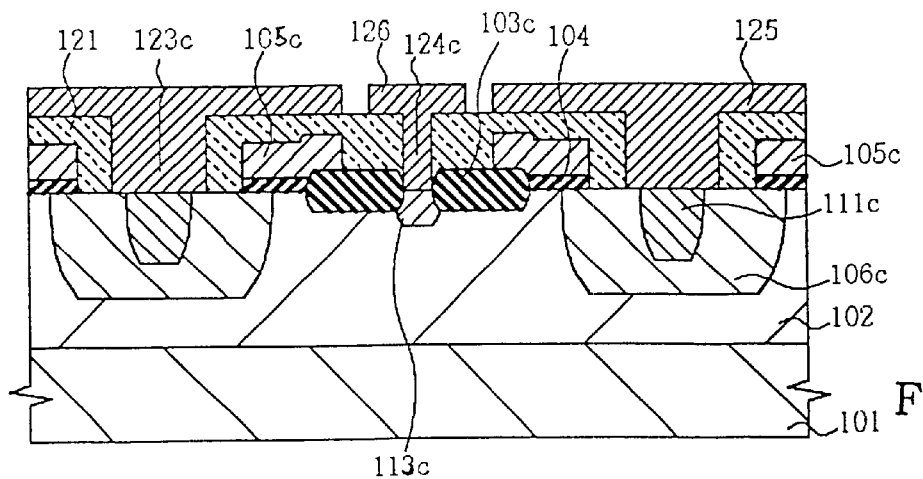
FIG. 7C is a cross sectional view taken along line B—B of FIG. 7A and showing the structure of the power field effect transistor exposed to the cross section.

Turning to FIGS. 7A to 7C, yet another power field effect transistor embodying the present invention is fabricated on a p-type silicon substrate 101. The power field effect transistor implementing the third embodiment differs from the power field effect transistor implementing the first embodiment in that a gate electrode 105c has constricted portions.

The power field effect transistor is fabricated on the p-type silicon substrate 101. The resistivity of the p-type silicon substrate 101 is of the order of 13.5 ohm-cm. The major surface of the p-type silicon substrate 101 is covered with a lightly doped n-type impurity region 102, and the lightly doped n-type impurity region 102 forms a p-n junction together with the p-type silicon substrate 101. The p-n junction between the p-type silicon substrate 101 and the lightly doped n-type impurity region 102 is of the order of 6 microns deep from the upper surface of the lightly doped n-type impurity region 102.

A field oxide layer 103c is grown in a surface portion of the lightly doped n-type impurity region 102 through a selective oxidation technique, and is of the order of 470 nanometers thick. The field oxide layer 103c is patterned in such a manner that a part of the lightly doped n-type impurity region 102 is exposed to a gap formed therein. The field oxide layer 103c is of the order of 3.0 microns wide.

Silicon oxide is thermally grown in another surface portion of the lightly doped n-type impurity region 102, and forms a gate oxide layer 104. The gate oxide layer 104 is of the order to 50 nanometers thick, and is contiguous to the field oxide layer 103c.

A gate electrode 105c is formed of heavily doped n-type polysilicon, and is of the order of 450 nanometers thick. The gate electrode 105c lies in a zigzag line, and, accordingly, has generally straight gate portions (see FIG. 7A) and folded portions between the gate portions. The gate portions of the gate electrode 105c are partially on the field oxide layer 103c and partially on the gate oxide layer 104. In other words, the gate portions of the gate electrode 105c are provided over the lightly doped n-type impurity region 102 partially through the gate oxide layer 104 and partially through the field oxide layer 103c. The field oxide layer 103c enhances the drain-and-gate breakdown voltage of the power field effect transistor.

The gate portions of the gate electrode 105c are locally constricted, and, accordingly, have respective straight portions and respective constricted portions. The constricted portions define dents, respectively, and the dent has a trapezoidal plane figure. The gate portions are cut along line A—A, and the cross sections of the straight portions are shown in FIG. 7B. The gate portions are further cut along line B—B, and the cross sections of the constricted portions are shown in FIG. 7C.

The field oxide layer 103c is overlapped with the gate electrode 105c as described hereinbefore, and the overlap portions are constant in width along the overall length of the gate portions. In this instance, the overlap portions are of the order of 1.0 micron wide. The non-overlap portions of the gate portions 105a are respectively located on the gate oxide layer 104. The constricted portions have the non-overlap portions, which are narrower than the non-overlap portions of the straight portions. In this instance, the straight portions are as wide as 2.5 microns, and the difference of the non-overlap portions between the straight portions and the projecting portions is of the order of 0.7 micron. The constricted portions have the dents on either side thereof (see FIG. 7A). The trapezoidal dent is as long as 1 micron, and the base angle at each corner is 45 degrees.

In a surface portion of the lightly doped n-type impurity region 102 is formed a p-type impurity region 106c which forms a p-n junction together with the lightly doped n-type impurity region 102. The p-n junction between the p-type impurity region 106c and the lightly doped n-type impurity region 102 is of the order of 1.5 microns deep, and is exposed to the upper surface of the lightly doped n-type impurity region 102 under the gate oxide layers 104. The p-type impurity region 106c locally projects into the lightly doped n-type impurity region 102 under the gate electrode 105c due to the trapezoidal dents. The projecting portions of the p-type impurity region 106c have a trapezoidal plane FIG. as shown in FIG. 7A.

As described hereinbefore, the gap is formed in the field oxide layer 103c. A heavily doped n-type impurity region 113c is formed in a surface portion of the lightly doped n-type impurity region 102, and is spaced from the p-type impurity region 106c. The heavily doped n-type impurity region 113c has a comb-like configuration, and one of the teeth is shown in FIGS. 7A to 7C. The heavily doped n-type impurity region 113c is of the order of 0.3 micron in depth.

A heavily doped p-type impurity region 111c is nested in the p-type impurity region 106c, and is laterally spaced from the gate electrode 105c. The heavily doped p-type impurity region 111c has a comb-like configuration, and the teeth of the comb-like heavily doped p-type impurity region 111c are interdigitated with the teeth of the heavily doped n-type impurity region 113c. The teeth of the comb-like heavily doped p-type impurity region 111c extend along the gate portions of the gate electrode 105c substantially in parallel. In other words, the gate electrode 105c extends along the gap between the teeth of the comb-like heavily doped n-type impurity region 113c and the teeth of the comb-like heavily doped p-type impurity region 111c. The heavily doped p-type impurity region 11c is of the order of 1 micron deep.

Heavily doped n-type impurity regions 112c are further formed in the p-type impurity region 106c, and are located between the heavily doped p-type impurity region 111c and the lightly doped n-type impurity region 102 under the gate electrode 105c. The heavily doped n-type impurity regions 112c are disconnected at the projecting portions of the p-type impurity region 106c, and are located along a virtual zigzag line, which extends along the gate electrode 105c. The heavily doped n-type impurity regions 112c are spaced from one another at the projecting portions of the p-type impurity region 106c, and the gap between the adjacent two heavily doped n-type impurity regions 112c is of the order of 3 microns. For this reason, the heavily doped n-type impurity regions 112c are not shown in FIG. 7C. The heavily doped n-type impurity regions 112c form p-n junctions together with the p-type impurity region 106c, and are exposed to the upper surface of the p-type impurity region 106c in such a manner as to be substantially aligned with the gate electrode 105c. The p-n junctions between the heavily doped n-type impurity regions 112c and the p-type impurity region 106c downwardly penetrate from the upper surface of the p-type impurity region 106c, and reach the depth of the order of 0.3 micron. Thus, the heavily doped n-type impurity regions 112c are as deep as the heavily doped n-type impurity region 113c.

The heavily doped n-type impurity region 113c serves as a drain contact region, and the lightly doped n-type impurity region 102 between the heavily doped n-type impurity region 113c and the p-type impurity region 106c, the heavily doped n-type impurity regions 112c and the p-type impurity region 106c respectively serve as a drain, a source and a channel forming region of the power field effect transistor. The channel length of the power field effect transistor is of the order of 1.0 micron. The gate portions are arranged at intervals of about 4.0 microns, and the heavily doped n-type source regions 112a are spaced by about 1.0 micron between the adjacent two gate portions.

The power field effect transistor according to the present invention includes the comb-like heavily doped n-type drain contact region 113c interdigitated with the comb-like heavily doped p-type impurity region 111c. The gate electrode 105c lies in the zigzag line between the teeth of the comb-like heavily doped n-type drain contact region 113c and the teeth of the comb-like heavily doped p-type impurity region 111c, and the heavily doped n-type source regions 112c are arranged on the virtual zigzag line between the gate electrode 105c and the heavily doped p-type impurity region 111c.

The power field effect transistor is covered with an inter-layered insulating layer 121, and source contact holes 123c and drain contact holes 124c are formed in the inter-layered insulating layer 121. The heavily doped n-type drain contact region 113c is exposed to the drain contact holes 124c, and the heavily doped n-type source regions 112c and the heavily doped p-type impurity region 111c are exposed to the source contact holes 123c. A source electrode 125 and a drain electrode 126 are patterned on the inter-layered insulating layer 121. The source electrode 125 penetrates through the source contact holes 123c, and is held in contact with the heavily doped n-type source regions 112c and the heavily doped p-type impurity region 111c. On the other hand, the drain electrode 126 penetrates through the drain contact holes 124c, and is held in contact with the heavily doped n-type drain contact region 113c.

When the excess voltage is applied to the drain electrode 126, the electric field is concentrated around the projecting portions of the p-type impurity region 106c, and the avalanche breakdown takes place. The breakdown current flows through the gap between the heavily doped n-type source regions 112c, and the potential level in the p-type impurity region 106c is merely slightly increased. Thus, the power field effect transistor implementing the third embodiment is improved as similar to the first embodiment.

The present inventor fabricated a sample EX.3 of the power field effect transistor, and connected the sample EX.3 as similar to the samples EX.1 and EX.2. The sample EX.3 was tested as similar to the other samples. The withstanding capability against inductive load was improved at 21 percent with respect to the prior art sample, and the withstanding capability against the time-varied drain voltage dV/dt was improved at 25 percent with respect to the prior art sample.

Fourth Embodiment

Figure 8A:
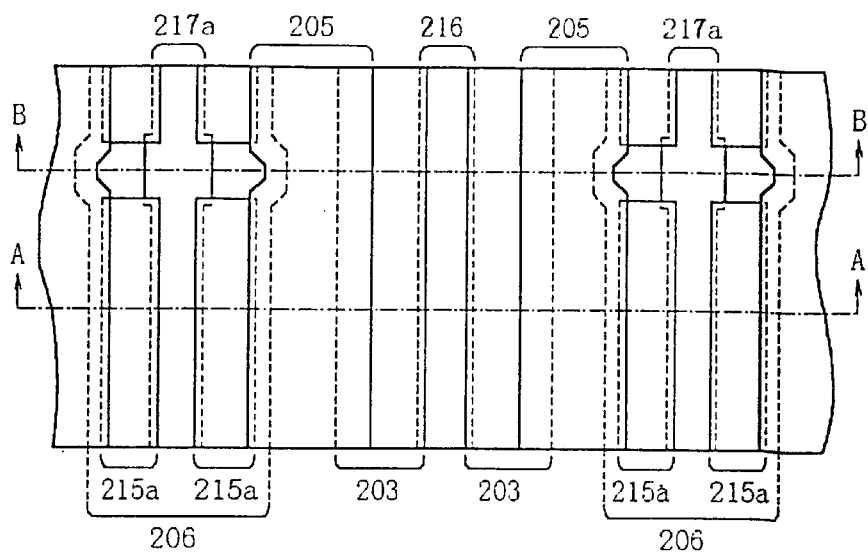
FIG. 8A is a plane view showing still another power field effect transistor incorporated in a semiconductor device according to the present invention.
Figure 8B:
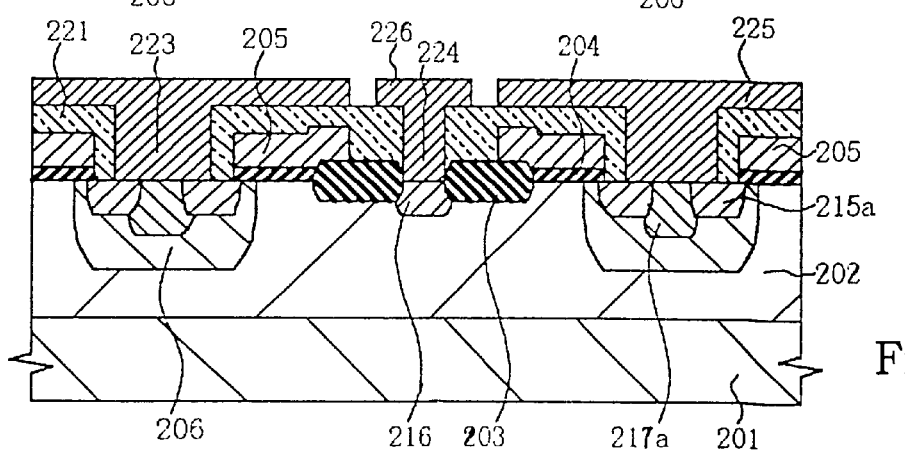
FIG. 8B is a cross sectional view taken along line A—A of FIG. 8A, and showing the structure of the power field effect transistor exposed to the cross section.
Figure 8C:
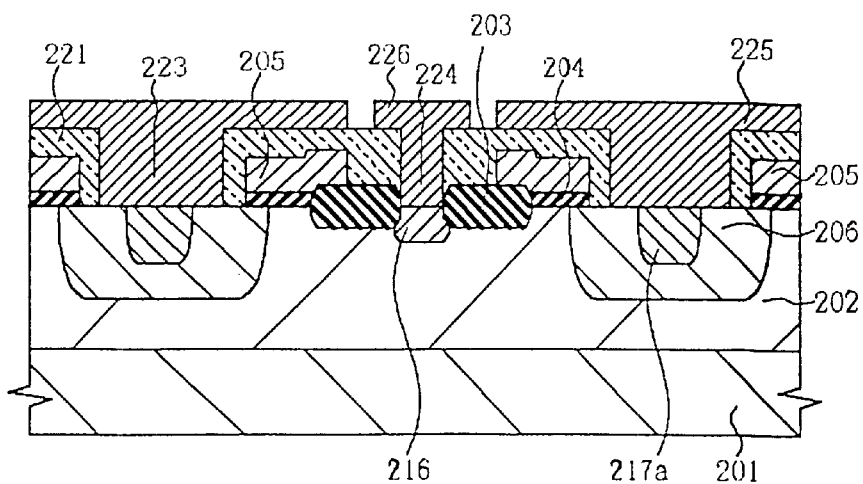
FIG. 8C is a cross sectional view taken along line B—B of FIG. 8A and showing the structure of the power field effect transistor exposed to the cross section.

Turning to FIGS. 8A to 8C, still another power field effect transistor embodying the present invention is fabricated on a p-type silicon substrate 201. The power field effect transistor is categorized in the LDMOS transistor. The power field effect transistor implementing the fourth embodiment is different from the first to third embodiments in that a heavily doped n-type source region 215a is self-aligned with a heavily doped p-type impurity region 217a.

The p-type silicon substrate 201 has the resistivity of the order of 13.5 ohm-cm. A lightly doped n-type drain layer 202 is laminated on the major surface of the p-type silicon substrate 201, and the lightly doped n-type impurity region 202 forms a p-n junction together with the p-type silicon substrate 201. The p-n junction between the p-type silicon substrate 201 and the lightly doped n-type impurity region 202 is of the order of 6 microns deep from the upper surface of the lightly doped n-type impurity region 202.

A field oxide layer 203 is grown in a surface portion of the lightly doped n-type impurity region 202 through a selective oxidation technique. The field oxide layer 203 is patterned in such a manner that a part of the lightly doped n-type impurity region 202 is exposed to a gap formed therein. Silicon oxide is thermally grown in another surface portion of the lightly doped n-type impurity region 202, and forms a gate oxide layer 204. The gate oxide layer 204 is contiguous to the field oxide layer 203.

A gate electrode 205 is formed of heavily doped n-type polysilicon, and lies in a zigzag line. Accordingly, the gate electrode 205 has generally straight gate portions (see FIG. 8A) and folded portions between the gate portions. The gate portions of the gate electrode 205 are partially on the field oxide layer 203 and partially on the gate oxide layer 204. In other words, the gate portions of the gate electrode 205 are provided over the lightly doped n-type impurity region 202 partially through the gate oxide layer 204 and partially through the field oxide layer 203. The field oxide layer 203 enhances the drain-and-gate breakdown voltage of the power field effect transistor. A cap layer of silicon oxide may be laminated on the gate electrode 205.

The gate portions of the gate electrode 205 are locally constricted, and, accordingly, have respective straight portions and respective constricted portions. The constricted portions define dents, respectively, and the dent has a trapezoidal plane figure. The gate portions are cut along line A—A, and the cross sections of the straight portions are shown in FIG. 8B. The gate portions are further cut along line B—B, and the cross sections of the constricted portions are shown in FIG. 8C. The gate electrode 205 is similar to the gate electrode 105c, and no further description is hereinbelow incorporated for the sake of simplicity.

In a surface portion of the lightly doped n-type impurity region 202 is formed a p-type impurity region 206 which forms a p-n junction together with the lightly doped n-type impurity region 202. The p-n junction between the p-type impurity region 206 and the lightly doped n-type impurity region 202 is of the order of 1.2 microns deep, and is exposed to the upper surface of the lightly doped n-type impurity region 202 under the gate oxide layers 204. The p-type impurity region 206 locally bulges out, and projects into the lightly doped n-type impurity region 202 under the gate electrode 205 due to the trapezoidal dents. The projecting portions of the p-type impurity region 206 have a trapezoidal plane figure as shown in FIG. 8A.

As described hereinbefore, the gap is formed in the field oxide layer 203. A heavily doped n-type impurity region 216 is formed in a surface portion of the lightly doped n-type impurity region 202 in a self-aligned manner with the field oxide layer 203, and is spaced from the p-type impurity region 206. The heavily doped n-type impurity region 216 has a comb-like configuration, and one of the teeth is shown in FIGS. 8A to 8C. The heavily doped n-type impurity region 216 is of the order of 0.3 micron in depth.

A heavily doped p-type impurity region 217a is nested in the p-type impurity region 206, and is laterally spaced from the gate electrode 205. The heavily doped p-type impurity region 217a has a comb-like configuration, and the teeth of the comb-like heavily doped p-type impurity region 217a are interdigitated with the teeth of the heavily doped n-type impurity region 216. The teeth of the comb-like heavily doped p-type impurity region 217a extend along the gate portions of the gate electrode 205 substantially in parallel. In other words, the gate electrode 205 extends along the gap between the teeth of the comb-like heavily doped n-type impurity region 216 and the teeth of the comb-like heavily doped p-type impurity region 217a. The heavily doped p-type impurity region 217a is of the order of 0.7 micron deep.

Heavily doped n-type impurity regions 215a are further formed in the p-type impurity region 206, and are located between the heavily doped p-type impurity region 217a and the lightly doped n-type impurity region 202 under the gate electrode 205. The heavily doped n-type impurity regions 215a are disconnected at the projecting portions of the p-type impurity region 206, and are located along a virtual zigzag line extending along the gate electrode 205. The heavily doped n-type impurity regions 215a are spaced from one another at the projecting portions of the p-type impurity region 206, and the gap between the adjacent two heavily doped n-type impurity regions 206 is of the order of 3 microns. For this reason, the heavily doped n-type impurity regions 215a are not shown in FIG. 5C. The heavily doped n-type impurity regions 215a form p-n junctions together with the p-type impurity region 206, and are exposed to the upper surface of the p-type impurity region 206 in such a manner as to be substantially aligned with the gate electrode 205. The heavily doped n-type impurity regions 215a further form p-n junctions together with the heavily doped p-type impurity region 217a, is self-aligned with the heavily doped p-type impurity region 217a. The heavily doped n-type impurity regions 215a are of the order of 0.3 micron deep. Thus, the heavily doped n-type impurity regions 215a are as deep as the heavily doped n-type impurity region 216.

The heavily doped n-type impurity region 216 serves as a drain contact region, and the lightly doped n-type impurity region 202 between the heavily doped n-type impurity region 215a and the p-type impurity region 206, the heavily doped n-type impurity regions 215a and the p-type impurity region 206 respectively serve as a drain, a source and a channel forming region of the power field effect transistor. The channel length of the power field effect transistor is of the order of 0.8 micron. The gate portions are arranged at intervals of about 3.5 microns, and the heavily doped n-type source regions 215a are spaced by about 0.7 micron between the adjacent two gate portions.

The power field effect transistor according to the present invention includes the comb-like heavily doped n-type drain contact region 216 interdigitated with the comb-like heavily doped p-type impurity region 217a. The gate electrode 205 lies in the zigzag line between the teeth of the comb-like heavily doped n-type drain contact region 216 and the teeth of the comb-like heavily doped p-type impurity region 217a, and the heavily doped n-type source regions 215a are arranged on the virtual zigzag line between the gate electrode 205 and the heavily doped p-type impurity region 217a.

The power field effect transistor is covered with an inter-layered insulating layer 221, and source contact holes 223 and drain contact holes 224 are formed in the inter-layered insulating layer 221. The heavily doped n-type drain contact region 216 is exposed to the drain contact holes 224, and the heavily doped n-type source regions 215a and the heavily doped p-type impurity region 217a are exposed to the source contact holes 223. A source electrode 225 and a drain electrode 226 are patterned on the inter-layered insulating layer 221. The source electrode 225 penetrates through the source contact holes 223, and is held in contact with the heavily doped n-type source regions 215a and the heavily doped p-type impurity region 217a. On the other hand, the drain electrode 226 penetrates through the drain contact holes 224, and is held in contact with the heavily doped n-type drain contact region 216.

The power field effect transistor implementing the fourth embodiment is fabricated as follows. The process starts with preparation of the p-type silicon substrate 201. Phosphorous is ion implanted into a surface portion of the p-type silicon substrate 201 assigned to the power field effect transistor at dosage of $2.5 \times 10^{12}$ cm$^{-2}$ at 150 KeV. After the ion-implantation, the phosphorous is activated through a heat treatment at 1200 degrees in centigrade for 8 hours. The ion-implanted phosphorous is diffused in the heat treatment, and forms the lightly doped n-type drain region 202. The lightly doped n-type impurity region 202 forms the p-n junction together with the p-type silicon substrate 201, and the bottom surface of the lightly doped n-type impurity region 202 is of the order of 6 microns deep.

The field oxide layer 203 is grown on the lightly doped n-type impurity region 202 in such a manner as to expose the surface portion of the lightly doped n-type impurity region 202 assigned to the heavily doped n-type drain contact region 216 to the cap formed therein. The gate forming region is partially overlapped with the field oxide layer 203.

Using, the field oxide layer 203 as a thermal oxidation mask, the lightly doped n-type impurity region 202 is oxidized so as to grow the gate oxide layer 204. The heavily doped n-type polysilicon is deposited over the entire surface of the resultant structure. Silicon oxide may be further deposited over the entire surface of the heavily doped n-type polysilicon layer.

A photo-resist etching mask (not shown) is prepared on the silicon oxide layer. Using the photo-resist etching, mask, the silicon oxide layer, the heavily doped n-type polysilicon layer and the gate oxide layer are selectively etched so that the gate electrode 205 is left partially on the field oxide layer 203 partially on the gate oxide layer 20 4. The gate portions are locally constricted, and the trapezoidal dents take place in the gate portions. The lightly doped n-type impurity region 202 is exposed to the gaps between the gate portions of the gate electrode 205. The photo-resist etching mask is stripped off.

The exposed surface of the lightly doped n-type impurity region 202 and the exposed surface of the gate electrode 205 are thermally oxidized so as to be covered with silicon oxide layers of several nanometers thick.

Another photo-resist ion-implntation mask (not shown) is prepared on the resultant structure. The photo-resist ion-implantation mask has an opening over the surface portion of the lightly doped n-type impurity region 202 to be assigned to the p-type impurity region 206. However, the surface portion to be assigned to the heavily doped n-type drain contact region 216 is covered with the photo-resist ion-implantation mask.

Using the photo-resist ion-implantation mask and the gate electrode 205 as an ion-implantation mask, boron is ion implanted into the exposed surface portion of the lightly doped n-type impurity region 202 at dosage of $10^{13}$ cm$^{-2}$ in a self-aligned manner with the gate electrode 205. The photo-resist ion-implantation mask is stripped off, and the boron is activated through a heat treatment. The boron forms the p-type impurity region 206, and the p-n junction between the p-type impurity region 206 and the lightly doped n-type impurity region 202 is of the order of 1.2 microns deep.

Silicon nitride is deposited to 10 nanometers thick over the entire surface of the resultant structure by using a low-pressure chemical vapor deposition technique, and forms a silicon nitride layer 231. Subsequently, silicon oxide is deposited over the entire surface of the silicon nitride layer 231 through the low pressure chemical vapor deposition, and the silicon oxide layer is laminated on the silicon nitride layer 231. The silicon oxide layer is chemically mechanically polished, and a flat surface is created on the silicon oxide layer. The gap over the p-type impurity region 206 is buried with the silicon oxide layer, and the silicon oxide layer over the p-type impurity region 206 has the flat upper surface slightly higher than the upper surface of the gate electrode (or the remaining silicon oxide layer) on the field oxide layer 203.

Figure 9A:
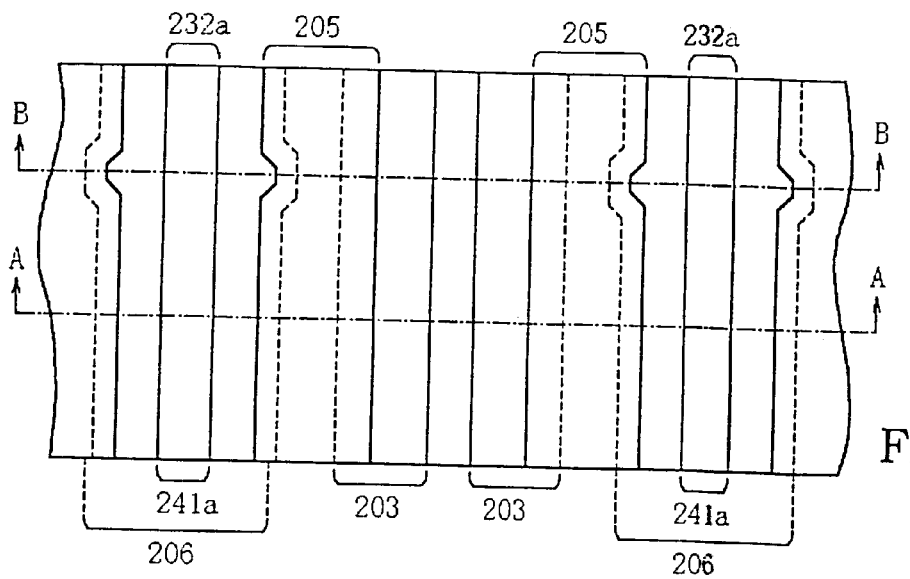
FIGS. 9A to 9C are plane views showing a process for fabricating the power field effect transistor shown in FIGS. 8A to 8C.
Figure 10A:
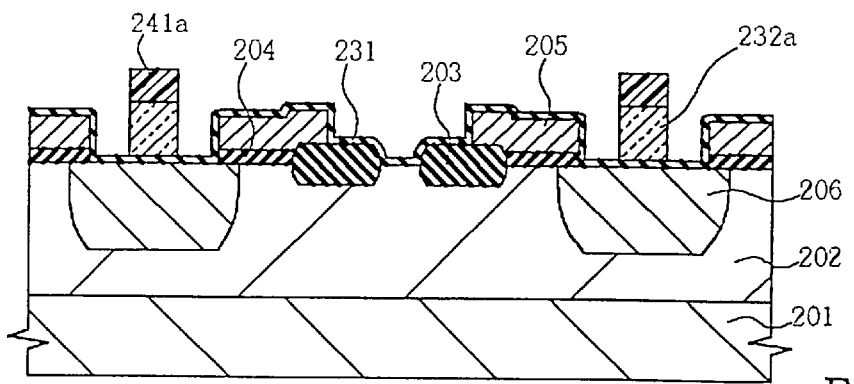
FIGS. 10A to 10C are cross sectional views taken along lines A—A of FIGS. 9A to 9C and showing the structures of the power field effect transistors at different steps.
Figure 11A:
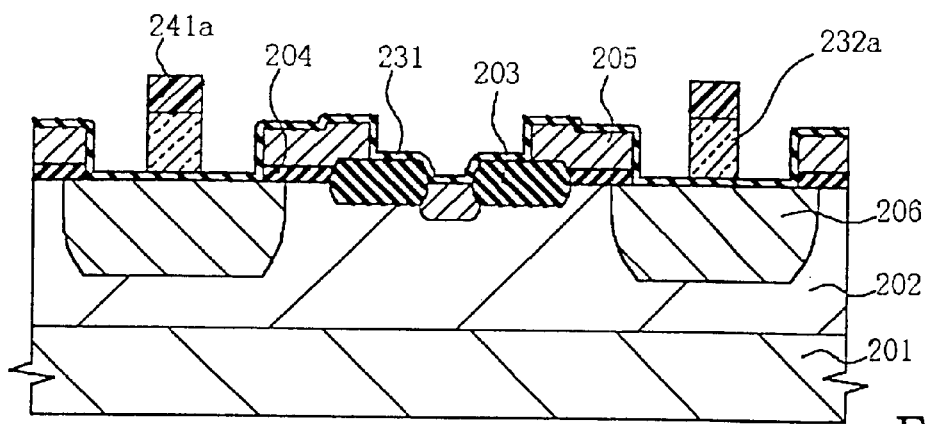
FIGS. 11A to 11C are cross sectional views taken along lines B—B of FIGS. 9A to 9C and showing the structures of the power field effect transistors at the different steps.

Subsequently, a photo-resist etching mask 241a is prepared on the resultant structure through the photo-lithographic techniques. The photo-resist etching mask 241a has a plane figure like the comb, and gaps are formed in the photo-resist etching mask 241a. The teeth of the comb-like photo-resist etching mask 241a ranges from 1.0 micron to 1.5 microns in width, and, accordingly, gaps are formed in the photo-resist etching mask 241a. The silicon oxide layer over a comb-like area in the p-type impurity region 206 is covered with the photo-resist ion-implantation mask 241a. The heavily doped p-type impurity region 217a is to be formed in the p-type impurity region 206 covered with the photo-resist etching mask 241a. Using the photo-resist etching mask 241a, the silicon oxide layer is subjected to an anistropic etching. Namely, the silicon oxide layer is selectively etched away by using dry etchant containing $C_4F_8$ and CO, and the silicon oxide layer is patterned into a silicon oxide ion-implantation mask 232a as shown in FIGS. 9A, 10A and 11A. Thus, the silicon oxide ion-implantation mask 232a is prepared on the surface portion assigned to the heavily doped p-type impurity region 217a. The photo-resist etching mask 241a is stripped off.

Subsequently, a photo-resist ion-implantation mask 242a is prepared on the resultant structure by using the photo-lithographic techniques. The photo-resist ion-implantation mask 242a has openings over the surface portions assigned to the heavily doped n-type drain contact region 216 and the heavily doped n-type source regions 215a. However, the silicon oxide ion-implantation mask 232a and the projecting portions between the heavily doped n-type source regions 215a are covered with the photo-resist ion-implantation mask 242a. The photo-resist ion-implantation mask 242a over the projecting portions is of the order of 3.0 to 3.2 microns wide.

Figure 9B:
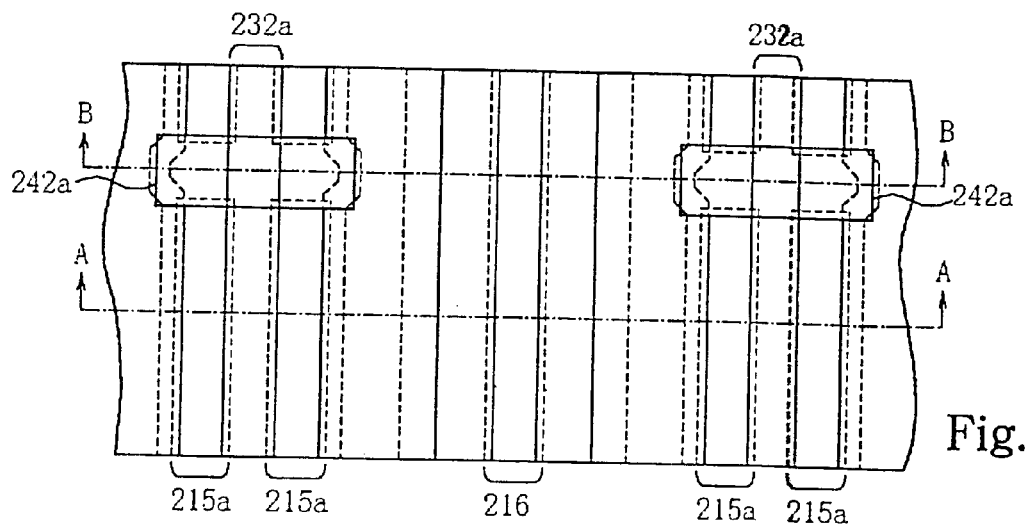
Figure 10B:
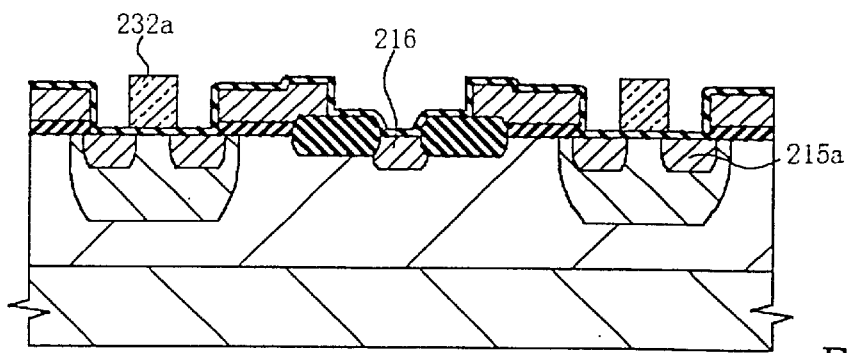
Figure 11B:
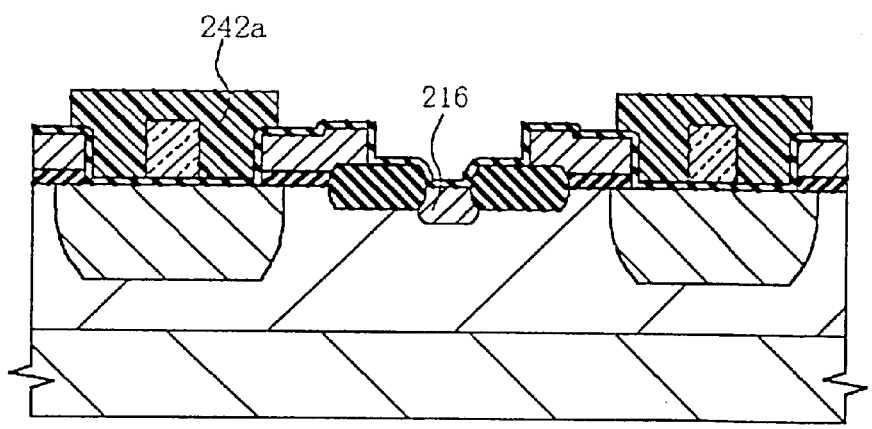

Using the photo-resist ion-implantation mask 242a and the silicon oxide ion-implantation mask 232a, arsenic is ion implanted into the surface portions at dosage of $1 \times 10^{16}$ cm$^{-2}$ at 300 to 350 KeV. After the ion-implantation, the photo-resist ion-implantation mask 242a is stripped off, and the ion-implanted arsenic is activated through a rapid annealing such as a lamp anneal. The arsenic forms the heavily doped n-type drain contact region 216 exposed to the gap in the field oxide layer 203 and the heavily doped n-type source regions 215a substantially aligned with the gate portions of the gate electrode 205. The heavily doped n-type drain contact region 216 is approximately equal in depth to the heavily doped n-type source regions 215a, and the depth is of the order of 0.3 micron. The heavily doped n-type source regions 215a are spaced at the projecting portions in the p-type impurity region 206 as shown in FIGS. 9B, 10B and 11B.

Subsequently, the entire surface of the resultant structure is covered with photo-resist, and the photo-resist layer is uniformly etched without any mask until the silicon oxide ion-implantation mask 232a is exposed. Thus, the photo-resist ion-implantation mask 243a is formed from the photo-resist layer, and the heavily doped drain contact region 216, the heavily doped n-type source regions and the p-type impurity region 206 between the heavily doped n-type source regions 215a are covered with the photo-resist ion-implantation mask 243a. The p-type impurity region 206 is partially covered with the photo-resist ion-implantation mask 243a and partially with the silicon oxide ion-implantation mask 232a.

Subsequently, the silicon oxide ion-implantation mask 232a is etched away by using an isotropic etching technique. Buffered hydrofluoric acid is, by way of example, used in the isotropic etching. When the silicon oxide ion-implantation mask 232a is removed, the surface portion assigned to the heavily doped p-type impurity region 217a is exposed to the gap uncovered with the photo-resist ion-implantation mask 243a.

Figure 9C:
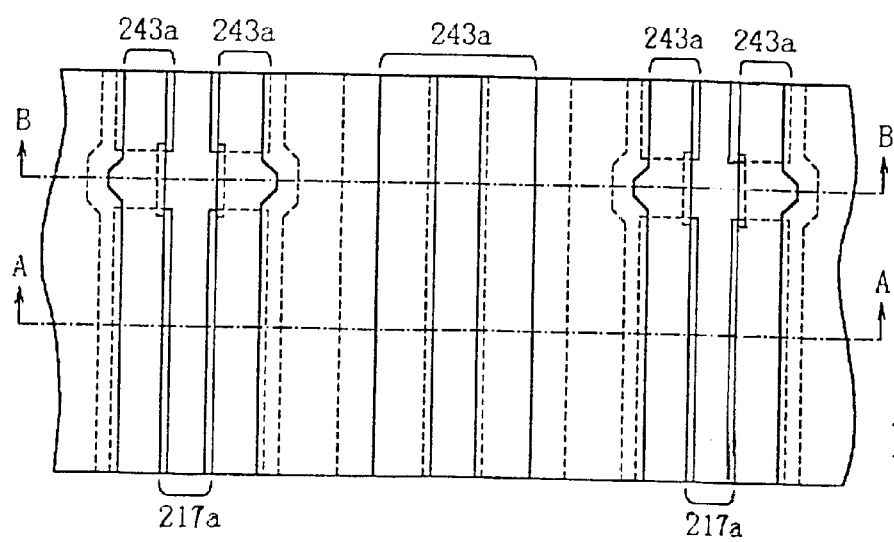
Figure 10C:
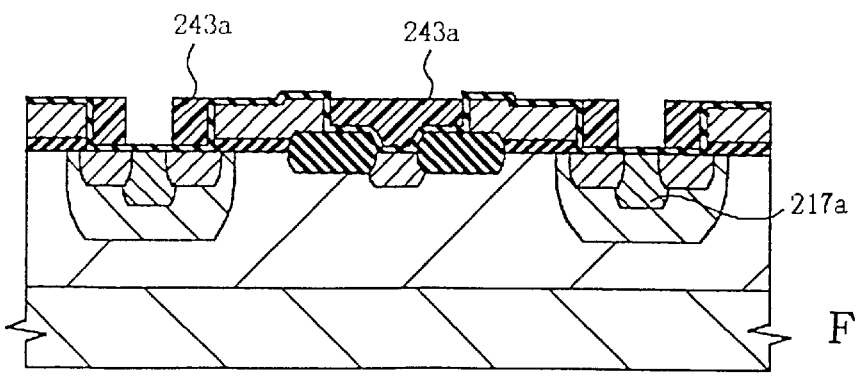
Figure 11C:
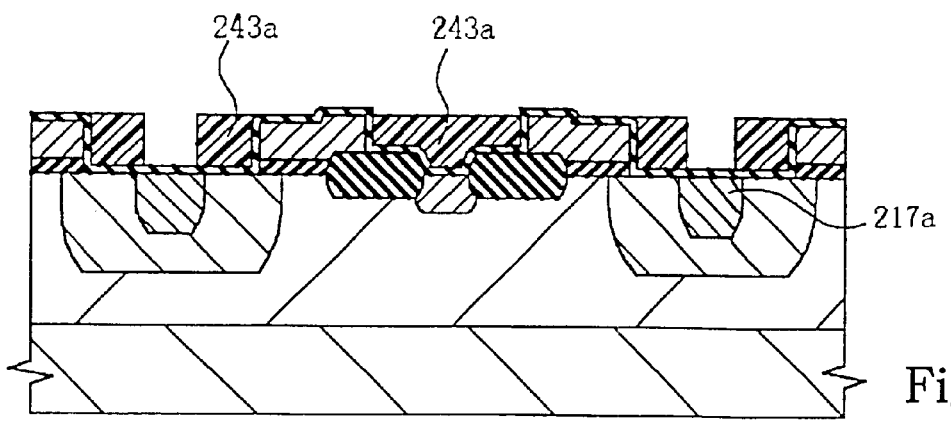

Using the photo-resist ion-implantation mask 243a, boron is ion implanted into the exposed surface portion at dosage of the order of $10^{15}$ cm$^{-2}$ at 150 to 180 KeV. The photo-resist ion-implantation mask 243a is stripped off, and the ion-implanted boron is activated through a rapid annealing such as, for example, the lamp anneal. The boron forms the heavily doped p-type impurity region 217a. The heavily doped p-type impurity region 217a is self-aligned with the heavily doped n-type source regions 215a except the projecting portions in the p-type impurity region 206, because the photo-resist ion-implanted mask 243a formed the boundary with the silicon oxide ion-implantation mask 232a. The resultant structure is shown in FIGS. 9C, 10C and 11C.

The silicon nitride layer 231 is etched away by using an isotropic etching technique. Hot phosphoric acid may be used in the isotropic etching. The silicon oxide layer was thermally grown before the deposition of the silicon nitride layer. The silicon oxide is of the order of several nanometers thick, and is etched away by using diluted hydrofluoric acid.

In this instance, the ion-implanted arsenic for the heavily doped n-type drain contact region 216 and the heavily doped n-type source regions 215a and the ion-implanted boron for the heavily doped p-type impurity region are activated through the rapid annealing differently carried out. In a modified process, both of the ion-implanted arsenic and the ion-implanted boron are concurrently annealed after the ion-implantation of the boron. The concurrent annealing may be carried out after the wet-etching for the silicon nitride layer.

Insulating material is deposited over the entire surface of the resultant structure, and forms the inter-layered insulating layer 221. A photo-resist etching mask is prepared on the inter-layered insulating layer 221 by using the photo-lithographic techniques, and has openings over the heavily doped n-type drain contact region 216 and the heavily doped n-type source regions 215a. The inter-layered insulating layer 221 is selectively etched away so as to form the drain contact holes 224 and the source contact holes 223. The photo-resist etching mask is stripped off.

Conductive material is deposited over the entire surface of the resultant structure. The source contact holes 223 and the drain contact holes 224 are buried with the conductive material, and swells into a conductive layer on the inter-layer insulating layer 221. A photo-resist etching mask is prepared on the conductive layer by using the photo-lithographic techniques, and the conductive layer is selectively etched away. When the etching is finished, the source electrode 225 and the drain electrode 226 are left on the inter-layered insulating layer 221, and are held in contact through the source contact holes 223 and the drain contact holes 224 with the heavily doped n-type drain contact region 216 and the heavily doped n-type source regions 215a, respectively.

The power field effect transistor implementing the fourth embodiment achieves all the advantageous of the third embodiment. Since the heavily doped p-type impurity region 217a is self-aligned with the heavily doped n-type source regions 215a, the manufacturer can design the p-type impurity region 206 to be shallower than those of the first to third embodiments. The shallow p-type impurity region 206 is conducive to reduction of the real estate assigned to the power field effect transistor. The reduction ratio for the power field effect transistor implementing the fourth embodiment is of the order of 10 percent.

Fifth Embodiment

Figure 12A:
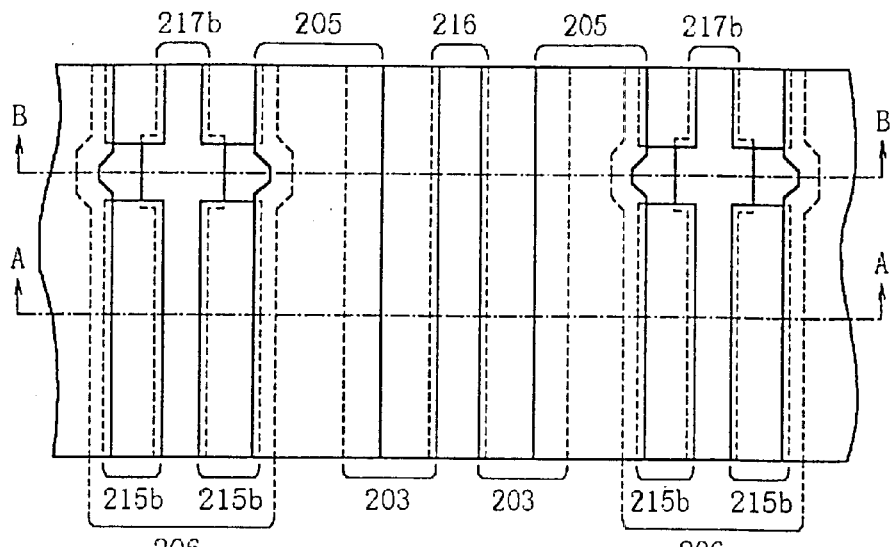
FIG. 12A is a plane view showing yet another power field effect transistor incorporated in a semiconductor device according to the present invention.
Figure 12B:
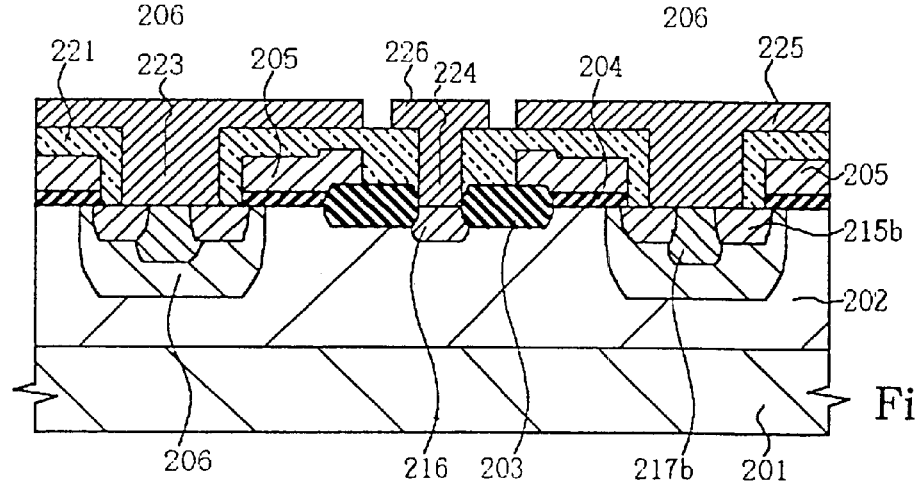
FIG. 12B is a cross sectional view taken along line A—A of FIG. 12A, and showing the structure of the power field effect transistor exposed to the cross section.
Figure 12C:
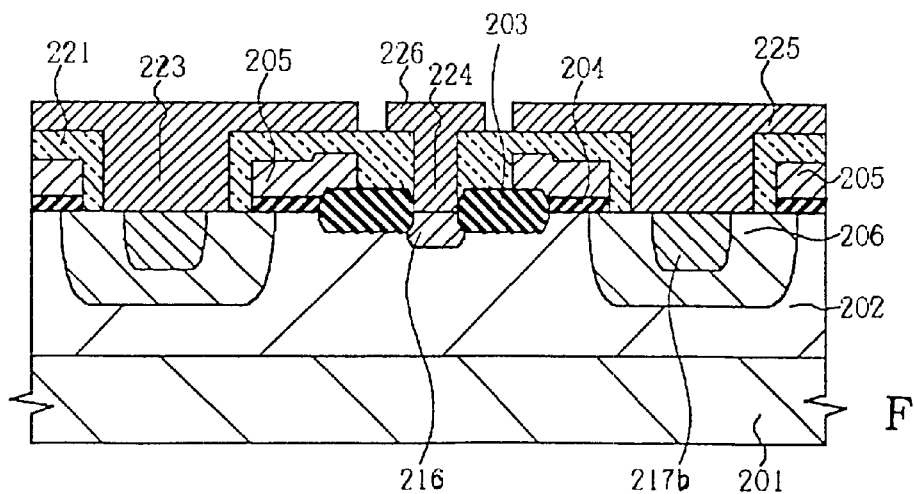
FIG. 12C is a cross sectional view taken along line B—B of FIG. 12A and showing the structure of the power field effect transistor exposed to the cross section.

FIGS. 12A to 12C show yet another power field effect transistor embodying the present invention. The field effect transistor embodying the present invention is fabricated on a p-type silicon substrate 201. The power field effect transistor is also categorized in the LDMOS transistor. The power field effect transistor implementing the fifth embodiment is different from the fourth embodiment in the configuration of a heavily doped p-type impurity region 217b. The heavily doped p-type impurity region 217b locally bulges out in a p-type impurity region 206 between heavily doped n-type source regions 215b.

The p-type silicon substrate 201 has the resistivity of the order of 13.5 ohm-cm. A lightly doped n-type drain layer 202 is laminated on the major surface of the p-type silicon substrate 201, and the lightly doped n-type impurity region 202 forms a p-n junction together with the p-type silicon substrate 201. The p-n junction between the p-type silicon substrate 201 and the lightly doped n-type impurity region 202 is of the order of 6 microns deep from the upper surface of the lightly doped n-type impurity region 202.

A field oxide layer 203 is grown in a surface portion of the lightly doped n-type impurity region 202 through a selective oxidation technique. The field oxide layer 203 is patterned in such a manner that a part of the lightly doped n-type impurity region 202 is exposed to a gap formed therein. Silicon oxide is thermally grown in another surface portion of the lightly doped n-type impurity region 202, and forms a gate oxide layer 204. The gate oxide layer 204 is contiguous to the field oxide layer 203.

A gate electrode 205 is formed of heavily doped n-type polysilicon, and lies in a zigzag line. Accordingly, the gate electrode 205 has generally straight gate portions (see FIG. 12A) and folded portions between the gate portions. The gate portions of the gate electrode 205 are partially on the field oxide layer 203 and partially on the gate oxide layer 204. In other words, the gate portions of the gate electrode 205 are provided over the lightly doped n-type impurity region 202 partially through the gate oxide layer 204 and partially through the field oxide layer 203. The field oxide layer 203 enhances the drain-and-gate breakdown voltage of the power field effect transistor. A cap oxide is formed on the gate electrode 205, if necessary.

The gate portions of the gate electrode 205 are locally constricted, and, accordingly, have respective straight portions and respective constricted portions. The constricted portions define dents, respectively, and the dent has a trapezoidal plane figure. The gate portions are cut along line A—A, and the cross sections of the straight portions are shown in FIG. 12B. The gate portions are further cut along line B—B, and the cross sections of the constricted portions are shown in FIG. 12C. The gate electrode 205 is similar to the gate electrode 105c, and no further description is hereinbelow incorporated for the sake of simplicity.

In a surface portion of the lightly doped n-type impurity region 202 is formed a p-type impurity region 206 which forms a p-n junction together with the lightly doped n-type impurity region 202. The p-n junction between the p-type impurity region 206 and the lightly doped n-type impurity region 202 is of the order of 1.2 microns deep, and is exposed to the upper surface of the lightly doped n-type impurity region 202 under the gate oxide layers 204. The p-type impurity region 206 locally bulges out, and projects into the lightly doped n-type impurity region 202 under the constricted portions of the gate electrode 205 due to the trapezoidal dents. The projecting portions of the p-type impurity region 206 have a trapezoidal plane figure as shown in FIG. 12A.

As described hereinbefore, the gap is formed in the field oxide layer 203. A heavily doped n-type impurity region 216 is formed in a surface portion of the lightly doped n-type impurity region 202 in a self-aligned manner with the field oxide layer 203, and is spaced from the p-type impurity region 206. The heavily doped n-type impurity region 216 has a comb-like configuration, and one of the teeth is shown in FIGS. 12A to 12C. The heavily doped n-type impurity region 216 is of the order of 0.3 micron in depth.

A heavily doped p-type impurity region 217b is nested in the p-type impurity region 206, and is laterally spaced from the gate electrode 205. The heavily doped p-type impurity region 217b has a comb-like configuration, and the teeth of the comb-like heavily doped p-type impurity region 217b are interdigitated with the teeth of the heavily doped n-type impurity region 216. The teeth of the comb-like heavily doped p-type impurity region 217b extend along the gate portions of the gate electrode 205 substantially in parallel. In other words, the gate electrode 205 extends along the gap between the teeth of the comb-like heavily doped n-type impurity region 216 and the teeth of the comb-like heavily doped p-type impurity region 217b. The heavily doped p-type impurity region 217b is of the order of 0.7 micron deep. The heavily doped p-type impurity region 217b bulges out in the projecting portions of the p-type impurity region 206 (compare FIG. 12B with FIG. 12C). The bulge portions of the heavily doped p-type impurity region 217b are opposed to the dents of the gate electrode 205.

The heavily doped n-type impurity regions 215b are further formed in the p-type impurity region 206, and are located between the heavily doped p-type impurity region 217b and the lightly doped n-type impurity region 202 under the gate electrode 205. The heavily doped n-type impurity regions 215b are disconnected at the projecting portions of the p-type impurity region 206, and are arranged along a virtual zigzag line extending along the gate electrode 205. The heavily doped n-type impurity regions 215b are spaced from the associated heavily doped n-type impurity regions 215b spaced in the direction of the gate portions at the projecting portions of the p-type impurity region 206, and the gap between the heavily doped n-type impurity region 215b and the associated heavily doped n-type impurity region 215b is of the order of 3 microns. For this reason, the heavily doped n-type impurity regions 215b are not shown in FIG. 12C. The heavily doped n-type impurity regions 215b form p-n junctions together with the p-type impurity region 206, and are exposed to the upper surface of the p-type impurity region 206 in such a manner as to be substantially aligned with the gate electrode 205. The heavily doped n-type impurity regions 215b further form p-n junctions together with the heavily doped p-type impurity region 217b, and is self-aligned with the heavily doped p-type impurity region 217b. The heavily doped n-type impurity regions 215b are of the order of 0.3 micron deep. Thus, the heavily doped n-type impurity regions 215b are as deep as the heavily doped n-type impurity region 216.

The heavily doped n-type impurity region 216 serves as a drain contact region, and the lightly doped n-type impurity region 202 between the heavily doped n-type impurity region 215b and the p-type impurity region 206, the heavily doped n-type impurity regions 215b and the p-type impurity region 206 respectively serve as a drain, a source and a channel forming region of the power field effect transistor. The channel length of the power field effect transistor is of the order of 0.8 micron. The gate portions are arranged at intervals of about 3.5 microns, and the heavily doped n-type source regions 215b are spaced by about 0.7 micron between the adjacent two gate portions.

The power field effect transistor according to the present invention includes the comb-like heavily doped n-type drain contact region 216 interdigitated with the comb-like heavily doped p-type impurity region 217b. The gate electrode 205 lies in the zigzag line between the teeth of the comb-like heavily doped n-type drain contact region 216 and the teeth of the comb-like heavily doped p-type impurity region 217b, and the heavily doped n-type source regions 215b are arranged on the virtual zigzag line between the gate electrode 205 and the heavily doped p-type impurity region 217b.

The power field effect transistor is covered with an inter-layered insulating layer 221, and source contact holes 223 and drain contact holes 224 are formed in the inter-layered insulating layer 221. The heavily doped n-type drain contact region 216 is exposed to the drain contact holes 224, and the heavily doped n-type source regions 215b and the heavily doped p-type impurity region 217b are exposed to the source contact holes 223. A source electrode 225 and a drain electrode 226 are patterned on the inter-layered insulating layer 221. The source electrode 225 penetrates through the source contact holes 223, and is held in contact with the heavily doped n-type source regions 215b and the heavily doped p-type impurity region 217b. On the other hand, the drain electrode 226 penetrates through the drain contact holes 224, and is held in contact with the heavily doped n-type drain contact regions 216.

Description is hereinbelow made on a process for fabricating the power field effect transistor with reference to FIGS. 13A to 13C, 14A to 14C and 15A to 15C.

The process starts with preparation of the p-type silicon substrate 201. Phosphorous is ion implanted into a surface portion of the p-type silicon substrate 201 assigned to the power field effect transistor at dosage of $5\times10^{12}$ cm$^{-2}$ at 150 KeV. After the ion-implantation, the phosphorous is activated through a heat treatment at 1200 degrees in centigrade for 8 hours. The ion-implanted phosphorous is diffused in the heat treatment, and forms the lightly doped n-type drain region 202. The lightly doped n-type impurity region 202 forms the p-n junction together with the p-type silicon substrate 201, and the bottom surface of the lightly doped n-type impurity region 202 is of the order of 6 microns deep.

The field oxide layer 203 is grown on the lightly doped n-type impurity region 202 in such a manner as to expose the surface portion of the lightly doped n-type impurity region 202 assigned to the heavily doped n-type drain contact region 216 to the gap formed therein. The gate forming region is partially overlapped with the field oxide layer 203.

Using the field oxide layer 203 as a thermal oxidation mask, the lightly doped n-type impurity region 202 is oxidized so that the gate oxide layer 204 is grown on the lightly doped n-type impurity region 202. The heavily doped n-type polysilicon is deposited over the entire surface of the resultant structure. Silicon oxide may be further deposited over the entire surface of the heavily doped n-type polysilicon layer.

A photo-resist etching mask (not shown) is prepared on the silicon oxide layer. Using the photo-resist etching mask, the silicon oxide layer, the heavily doped n-type polysilicon layer and the gate oxide layer are selectively etched so that the gate electrode 205 is left partially on the field oxide layer 203 partially on the gate oxide layer 204. The gate portions are locally constricted, and the trapezoidal dents take place in the gate portions. The lightly doped n-type impurity region 202 is exposed to the gaps between the gate portions of the gate electrode 205. The photo-resist etching mask is stripped off.

The exposed surface of the lightly doped n-type impurity region 202 and the exposed surface of the gate electrode 205 are thermally oxidized so as to be covered with silicon oxide layers of several nanometers thick.

Another photo-resist ion-implantation mask (not shown) is prepared on the resultant structure. The photo-resist ion-implantation mask has an opening over the surface portion of the lightly doped n-type impurity region 202 assigned to the p-type impurity region 206. However, the surface portion assigned to the heavily doped n-type drain contact region 216 is covered with the photo-resist ion-implantation mask.

Using the photo-resist ion-implantation mask and the gate electrode 205 as an ion-implantation mask, boron is ion implanted into the exposed surface portion of the lightly doped n-type impurity region 202 at dosage of $10^{13}$ cm$^{-2}$ in a self-aligned manner with the gate electrode 205. The photo-resist ion-implantation mask is stripped off, and the boron is activated through a heat treatment. The boron forms the p-type impurity region 206, and the p-n junction between the p-type impurity region 206 and the lightly doped n-type impurity region 202 is of the order of 1.2 microns deep.

Silicon nitride is deposited to 10 nanometers thick over the entire surface of the resultant structure by using a low-pressure chemical vapor deposition technique, and forms a silicon nitride layer 231. Subsequently, silicon oxide is deposited over the entire surface of the silicon nitride layer 231 through the low pressure chemical vapor deposition, and the silicon oxide layer is laminated on the silicon nitride layer 231. The silicon oxide layer is chemically mechanically polished, and a flat surface is created on the silicon oxide layer. The gap over the p-type impurity region 206 is buried with the silicon oxide layer, and the silicon oxide layer over the p-type impurity region 206 has the flat upper surface slightly higher than the upper surface of the gate electrode (or the remaining silicon oxide layer) on the field oxide layer 203.

Subsequently, a photo-resist mask 241b is prepared on the silicon oxide layer through the photo-lithographic techniques. The photo-resist mask 241b has a plane figure like the comb, and gaps are formed in the photo-resist etching mask 241b. The teeth of the comb-like photo-resist mask 241b have straight portions and bulge portions. The straight portions range from 1.0 micron to 1.5 microns in width, and the bulge portions range from 3.0 microns to 3.2 microns in width. Gaps are formed in the photo-resist mask 241b, and are locally constricted over the p-type impurity region 206 between the portions assigned to the heavily doped n-type source regions 215b. The surface portions assigned to the heavily doped n-type drain contact region 216 and the heavily doped n-type source regions 215b are exposed to the gaps in the photo-resist mask 241b. Thus, the silicon oxide layer over the comb-like area in the p-type impurity region 206 is covered with the photo-resist ion-implantation mask 241b. The heavily doped p-type impurity region 217b is to be formed in the p-type impurity region 206 covered with the photo-resist etching mask 241b as will be described hereinlater. Using the photo-resist mask 241b, the silicon oxide layer is subjected to an anisotropic etching. Namely, the silicon oxide layer is selectively etched away by using dry etchant containing $C_4F_8$ and CO, and the silicon oxide layer is patterned into a silicon oxide mask 232b. Thus, the silicon oxide mask 232b is prepared on the surface portion assigned to the heavily doped p-type impurity region 217b.

Figure 13A:
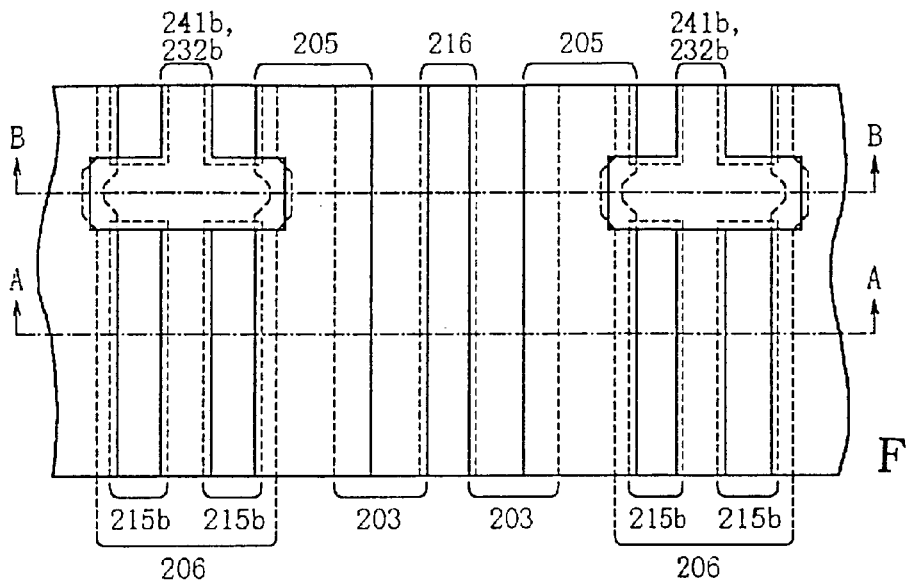
FIGS. 13A to 13C are plane views showing a process for fabricating the power field effect transistor shown in FIGS. 12A to 12C.
Figure 14A:
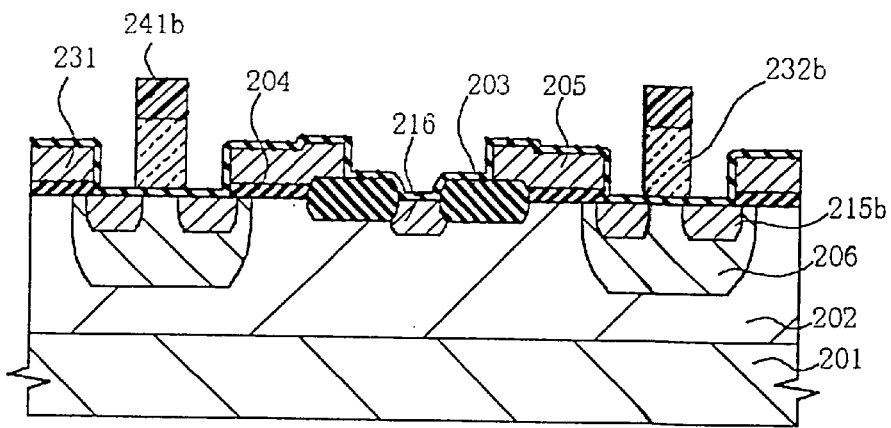
FIGS. 14A to 14C are cross sectional views taken along lines A—A of FIGS. 13A to 13C and showing the structures of the power field effect transistors at different steps.
Figure 15A:
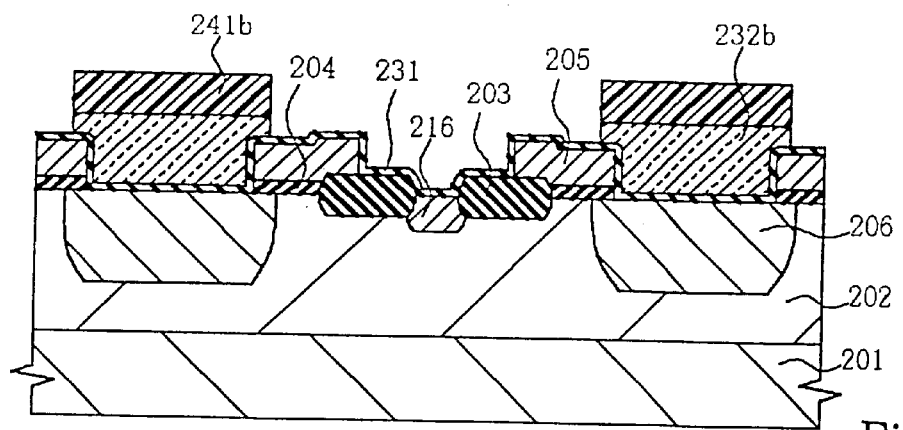
FIGS. 15A to 15C are cross sectional views taken along lines B—B of FIGS. 13A to 13C and showing the structures of the power field effect transistors at the different steps.

Using the photo-resist mask 241b on the silicon oxide mask 232b, arsenic is ion implanted into the surface portions at dosage of $1 \times 10^{16}$ cm$^{-2}$ at 300 to 350 KeV in a self-aligned manner with the gate electrode 205 and the silicon oxide mask 232b. The photo-resist etching mask 241b is stripped off. Thereafter, the ion-implanted arsenic is activated through a rapid annealing such as, for example, a lamp anneal. The arsenic forms the heavily doped n-type drain contact region 216 and the heavily doped n-type source regions 215b as shown in FIGS. 13A, 14A and 15A. The heavily doped n-type drain contact region 216 is self-aligned with the field oxide layer 203, and the heavily doped n-type source regions 215b are self-aligned with the gate electrode 205 and the silicon oxide mask 232b. The heavily doped n-type drain contact region 216 and the heavily doped n-type source regions 215b are of the order of 0.3 micron deep, and the heavily doped n-type source regions 215b are disconnected at the projecting portions in the p-type impurity region 206.

Subsequently, a photo-resist mask 242b is prepared on the resultant structure by using the photo-lithographic techniques. The photo-resist mask 242b has openings over the projecting portions on both sides of the surface portion assigned to the heavily doped p-type impurity region 217b, and the silicon oxide mask 232b over the surface portion assigned to the heavily doped p-type impurity region 217b and the heavily doped n-type source regions 215b are covered with the photo-resist mask 242b. The openings measure at least 3.5 microns in the direction parallel to the gate portions of the gate electrode 205.

Figure 13B:
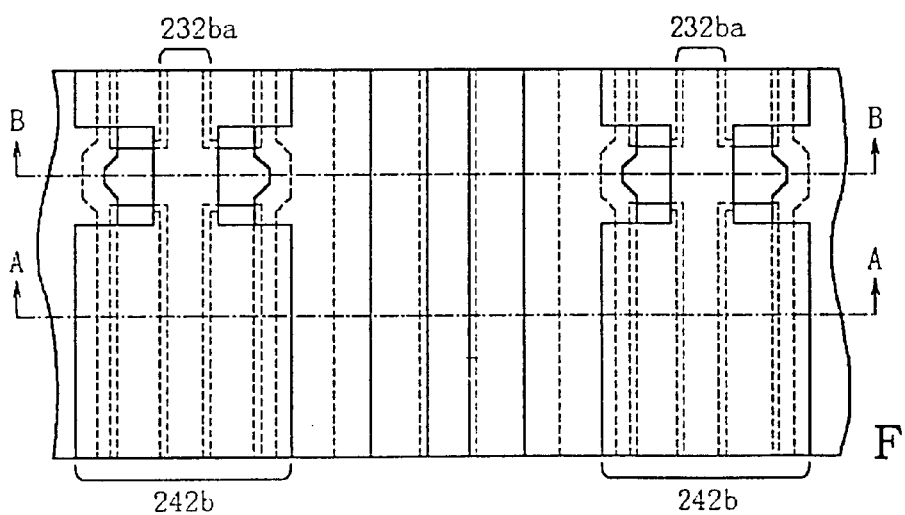
Figure 14B:
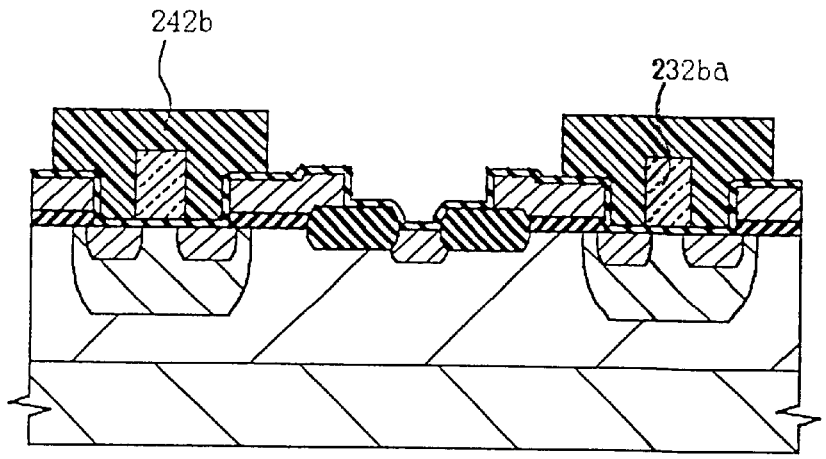
Figure 15B:
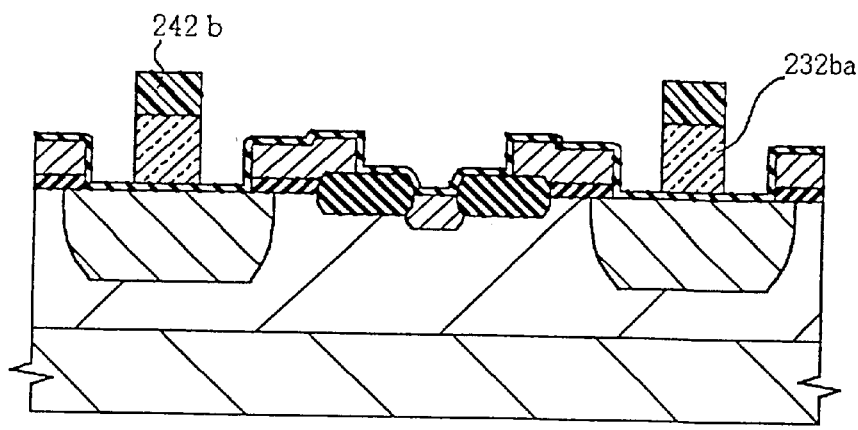

Using the photo-resist mask 242b, the silicon oxide mask 232b is partially etched away by using the unisotropic etching technique, and the silicon oxide mask 232b is formed into a silicon oxide mask 232b a as shown in FIGS. 13B, 14B and 15B. The photo-resist mask 242b is stripped off.

Subsequently, the entire surface of the resultant structure is covered with photo-resist, and the photo-resist layer is uniformly etched without any mask until the silicon oxide mask 232b a is exposed. Thus, the photo-resist ion-implantation mask 243b is formed from the photo-resist layer, and the heavily doped drain contact region 216, the heavily doped n-type source regions 215b and the p-type impurity region 206 between the heavily doped n-type source regions 215b are covered with the photo-resist ion-implantation mask 243b. The p-type impurity region 206 is partially covered with the photo-resist ion-implantation mask 243b and partially with the silicon oxide mask 232ba.

Subsequently, the silicon oxide mask 232ba is etched away by using an isotropic etching technique. Buffered hydrofluoric acid is, by way of example, used in the isotropic etching. When the silicon oxide mask 232a is removed, the surface portion assigned to the heavily doped p-type impurity region 217b is exposed to the gap uncovered with the photo-resist ion-implantation mask 243b.

Figure 13C:
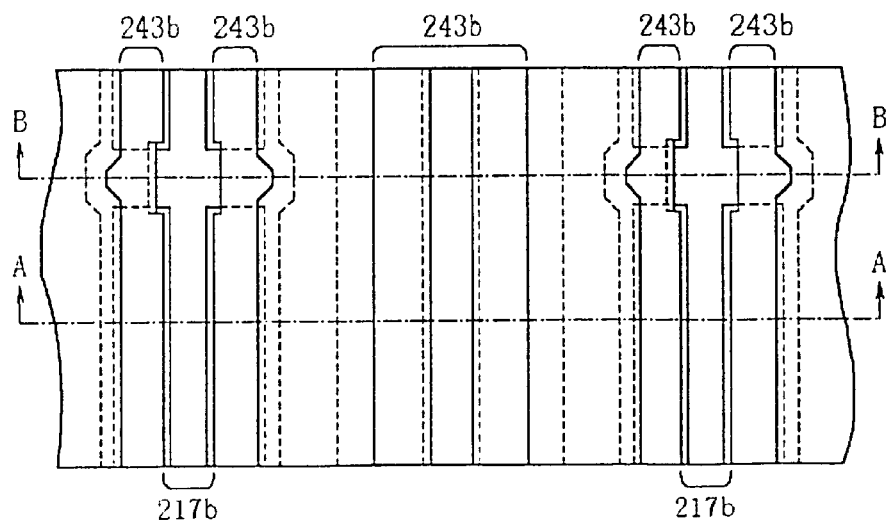
Figure 14C:
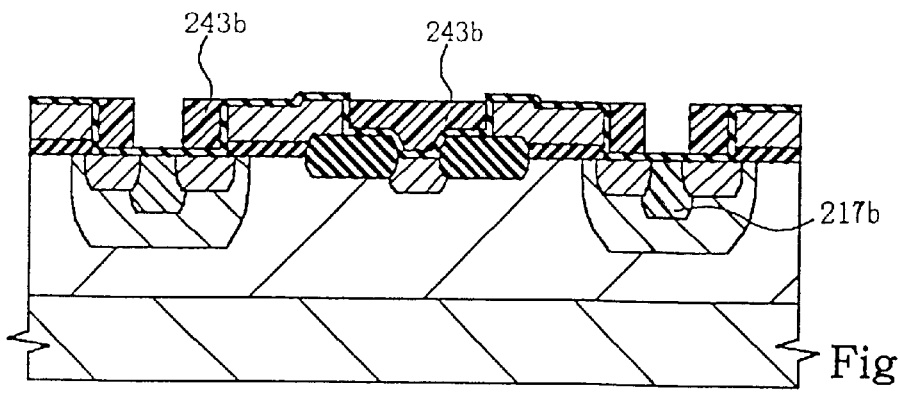
Figure 15C:
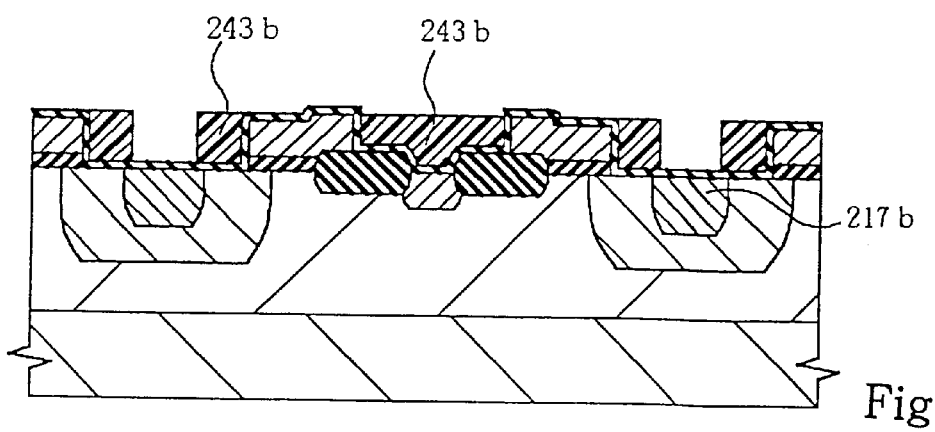

Using the photo-resist ion-implantation mask 243b, boron is ion implanted into the exposed surface portion at dosage of the order of $10^{15}$ cm$^{-2}$ at 150 to 180 KeV. The photo-resist ion-implantation mask 243b is stripped off, and the ion-implanted boron is activated through a rapid annealing such as, for example, the lamp anneal. The boron forms the heavily doped p-type impurity region 217b. The heavily doped p-type impurity region 217b is selfaligned with the heavily doped n-type source regions 215b except the projecting portions in the p-type impurity region 206. The resultant structure is shown in FIGS. 13C, 14C and 15C.

The silicon nitride layer 231 is etched away by using an isotropic etching technique. Hot phosphoric acid may be used in the isotropic etching. The silicon oxide layer was thermally grown before the deposition of the silicon nitride layer. The silicon oxide is of the order of several nanometers thick, and is etched away by using diluted hydrofluoric acid.

In this instance, the ion-implanted arsenic for the heavily doped n-type drain contact region 216 and the heavily doped n-type source regions 215a and the ion-implanted boron for the heavily doped p-type impurity region are activated through the rapid annealing differently carried out. In a modified process, both of the ion-implanted arsenic and the ion-implanted boron are concurrently annealed after the ion-implantation of the boron. The concurrent annealing may be carried out after the wet-etching, on the silicon nitride layer.

Insulating material is deposited over the entire surface of the resultant structure, and forms the inter-layered insulating layer 221. A photo-resist etching mask is prepared on the inter-layered insulating layer 221 by using the photo-lithographic techniques, and has openings over the heavily doped n-type drain contact region 216 and the heavily doped n-type source regions 215b. The inter-layered insulating layer 221 is selectively etched away so as to form the drain contact holes 224 and the source contact holes 223. The photo-resist etching mask is stripped off.

Conductive material is deposited over the entire surface of the resultant structure. The source contact holes 223 and the drain contact holes 224 are buried with the conductive material, and swells into a conductive layer on the inter-layered insulating layer 221. A photo-resist etching mask is prepared on the conductive layer by using the photo-lithographic techniques, and the conductive layer is selectively etched away. When the etching is finished, the source electrode 225 and the drain electrode 226 are left on the inter-layered insulating layer 221, and are held in contact through the source contact holes 223 and the drain contact holes 224 with the heavily doped n-type drain contact region 216 and the heavily doped n-type source regions 215a, respectively.

The power field effect transistor implementing the fifth embodiment achieves all the advantages of the fourth embodiment.

Sixth Embodiment

Figure 16A:
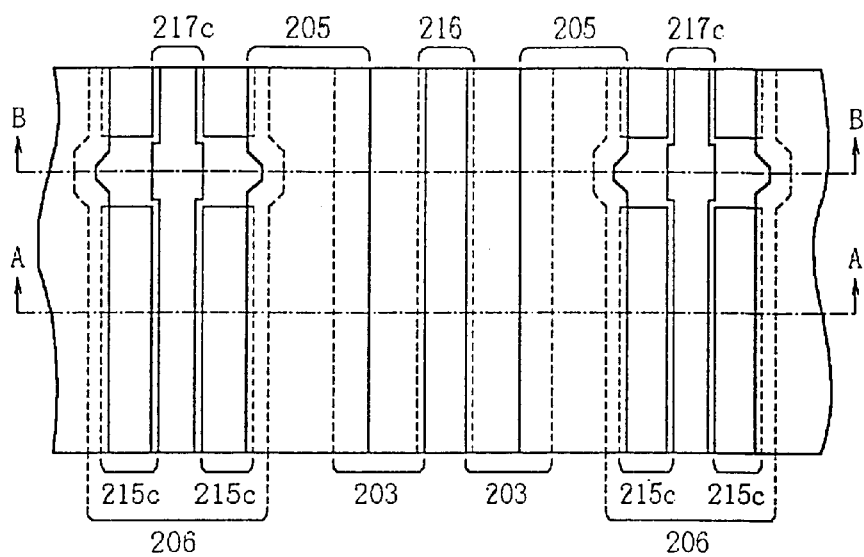
FIG. 16A is a plane view showing still another power field effect transistor incorporated in a semiconductor device according to the present invention.
Figure 16B:
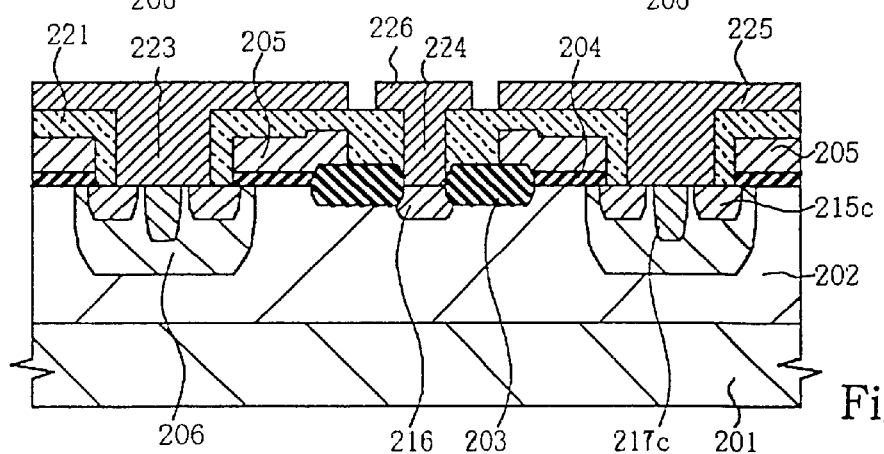
FIG. 16B is a cross sectional view taken along line A—A of FIG. 16A, and showing the structure of the power field effect transistor exposed to the cross section.
Figure 16C:
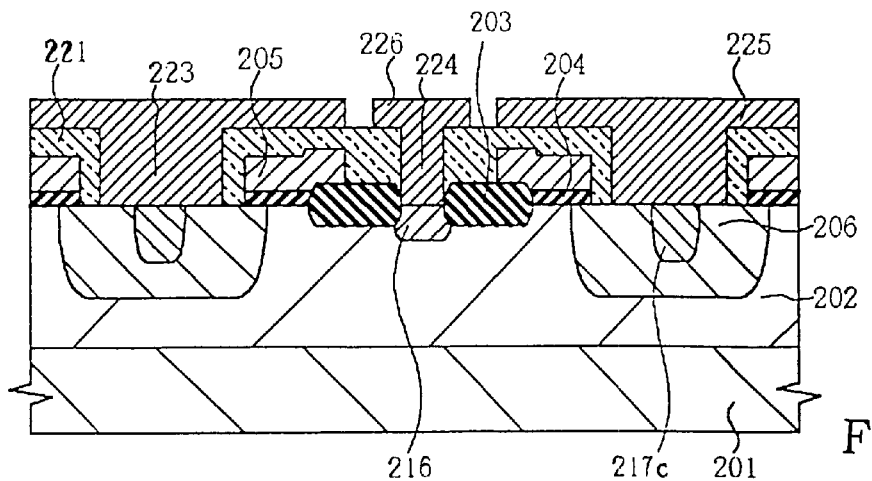
FIG. 16C is a cross sectional view taken along line B—B of FIG. 16A and showing the structure of the power field effect transistor exposed to the cross section.

FIGS. 16A, 16B and 16C show still another power field effect transistor embodying the present invention. The field effect transistor embodying the present invention is fabricated on a p-type silicon substrate 201. The power field effect transistor is also categorized in the LDMOS transistor. The power field effect transistor implementing the fifth embodiment is different from the fourth and fifth embodiments in that a heavily doped p-type impurity region 217c is spaced from heavily doped n-type source regions 215c.

The p-type silicon substrate 201 has the resistivity of the order of 13.5 ohm-cm. A lightly doped n-type drain layer 202 is laminated on the major surface of the p-type silicon substrate 201, and the lightly doped n-type impurity region 202 forms a p-n junction together with the p-type silicon substrate 201. The p-n junction between the p-type silicon substrate 201 and the lightly doped n-type impurity region 202 is of the order of 6 microns deep from the upper surface of the lightly doped n-type impurity region 202.

A field oxide layer 203 is grown in a surface portion of the lightly doped n-type impurity region 202 through a selective oxidation technique. The field oxide layer 203 is patterned in such a manner that a part of the lightly doped n-type impurity region 202 is exposed to a gap formed therein. Silicon oxide is thermally grown in another surface portion of the lightly doped n-type impurity region 202, and forms a gate oxide layer 204. The gate oxide layer 204 is contiguous to the field oxide layer 203.

A gate electrode 205 is formed of heavily doped n-type polysilicon, and lies in a zigzag line. Accordingly, the gate electrode 205 has generally straight gate portions (see FIG. 16A) and folded portions between the gate portions. The gate portions of the gate electrode 205 are partially on the field oxide layer 203 and partially on the gate oxide layer 204. In other words, the gate portions of the gate electrode 205 are provided over the lightly doped n-type impurity region 202 partially through the gate oxide layer 204 and partially through the field oxide layer 203. The field oxide layer 203 enhances the drain-and-gate breakdown voltage of the power field effect transistor. A cap oxide is formed on the gate electrode 205, if necessary.

The gate portions of the gate electrode 205 are locally constricted, and, accordingly, have respective straight portions and respective constricted portions. The constricted portions define dents, respectively, and the dent has a trapezoidal plane figure. The gate portions are cut along line A—A, and the cross sections of the straight portions are shown in FIG. 16B. The gate portions are further cut along line B—B, and the cross sections of the constricted portions are shown in FIG. 16C. Thus, the gate electrode 205 is similar to that of the fifth embodiment, and no further description is hereinbelow incorporated for the sake of simplicity.

In a surface portion of the lightly doped n-type impurity region 202 is formed a p-type impurity region 206 which forms a p-n junction together with the lightly doped n-type impurity region 202. The p-n junction between the p-type impurity region 206 and the lightly doped n-type impurity region 202 is of the order of 1.2 microns deep, and is exposed to the upper surface of the lightly doped n-type impurity region 202 under the gate oxide layers 204. The p-type impurity region 206 locally bulges out, and projects into the lightly doped n-type impurity region 202 under the constricted portions of the gate electrode 205 due to the trapezoidal dents. The projecting portions of the p-type impurity region 206 also have a trapezoidal plane figure as shown in FIG. 16A.

As described hereinbefore, the gap is formed in the field oxide layer 203. A heavily doped n-type impurity region 216 is formed in a surface portion of the lightly doped n-type impurity region 202 in a self-aligned manner with the field oxide layer 203, and is spaced from the p-type impurity region 206. The heavily doped n-type impurity region 216 has a comb-like configuration, and one of the teeth is shown in FIGS. 16A to 16C. The heavily doped n-type impurity region 216 is of the order of 0.3 micron in depth.

A heavily doped p-type impurity region 217c is nested in the p-type impurity region 206, and is laterally spaced from the gate electrode 205. The heavily doped p-type impurity region 217c has a comb-like configuration, and the teeth of the comb-like heavily doped p-type impurity region 217c are interdigitated with the teeth of the heavily doped n-type impurity region 216. The teeth of the comb-like heavily doped p-type impurity region 217c extend along the gate portions of the gate electrode 205 substantially in parallel. In other words, the gate electrode 205 extends along the gap between the teeth of the comb-like heavily doped n-type impurity region 216 and the teeth of the comb-like heavily doped p-type impurity region 217c. The heavily doped p-type impurity region 217c is of the order of 0.7 micron deep. The heavily doped p-type impurity region 217c bulges out in the projecting portions of the p-type impurity region 206 (compare FIG. 16B with FIG. 16C). The bulge portions of the heavily doped p-type impurity region 217c are opposed to the dents of the gate electrode 205.

The heavily doped n-type impurity regions 215c are further formed in the p-type impurity region 206, and are located between the heavily doped p-type impurity region 217b and the lightly doped n-type impurity region 202 under the gate electrode 205. The heavily doped n-type impurity regions 215c are spaced from the heavily doped p-type impurity region 217c as will be seen in FIG. 16B. The gap between the heavily doped n-type impurity regions 215c and the heavily doped p-type impurity region 217c ranges from 0.05 micron to 0.2 micron. The heavily doped n-type impurity regions 215c are disconnected at the projecting portions of the p-type impurity region 206, and are arranged along a virtual zigzag line extending along the gate electrode 205. In order words, the heavily doped n-type impurity regions 215c are spaced from one another at the projecting portions of the p-type impurity region 206, and the gap between the heavily doped n-type impurity region 215c and the associated heavily doped n-type impurity region 215c is of the order of 3 microns. For this reason, the heavily doped n-type impurity regions 215b are not shown in FIG. 16C. The heavily doped n-type impurity regions 215c form p-n junctions together with the p-type impurity region 206, and are exposed to the upper surface of the p-type impurity region 206 in such a manner as to be substantially aligned with the gate electrode 205. The heavily doped n-type impurity regions 215c are of the order of 0.3 micron deep. Thus, the heavily doped n-type impurity regions 215c are as deep as the heavily doped n-type impurity region 216.

The heavily doped n-type impurity region 216 serves as a drain contact region, and the lightly doped n-type impurity region 202 between the heavily doped n-type impurity region 215c and the p-type impurity region 206, the heavily doped n-type impurity regions 215c and the p-type impurity region 206 respectively serve as a drain, a source and a channel forming region of the power field effect transistor. The channel length of the power field effect transistor is of the order of 0.8 micron. The gate portions are arranged at intervals of about 3.5 microns, and the heavily doped n-type source regions 215b are spaced by about 0.7 micron between the adjacent two gate portions.

The power field effect transistor according to the present invention includes the comb-like heavily doped n-type drain contact region 216 interdigitated with the comb-like heavily doped p-type impurity region 217c. The gate electrode 205 lies in the zigzag line between the teeth of the comb-like heavily doped n-type drain contact region 216 and the teeth of the comb-like heavily doped p-type impurity region 217c, and the heavily doped n-type source regions 215c are arranged on the virtual zigzag line between the gate electrode 205 and the heavily doped p-type impurity region 217c at the intervals.

The power field effect transistor is covered with an inter-layered insulating layer 221, and source contact holes 223 and drain contact holes 224 are formed in the inter-layered insulating layer 221. The heavily doped n-type drain contact region 216 is exposed to the drain contact holes 224, and the heavily doped n-type source regions 215b and the heavily doped p-type impurity region 217b are exposed to the source contact holes 223. A source electrode 225 and a drain electrode 226 are patterned on the inter-layered insulating layer 221. The source electrode 225 penetrates through the source contact holes 223, and is held in contact with the heavily doped n-type source regions 215b and the heavily doped p-type impurity region 217b. On the other hand, the drain electrode 226 penetrates through the drain contact holes 224, and is held in contact with the heavily doped n-type drain contact regions 216.

Description is hereinbelow made on a process for fabricating the power field effect transistor with reference to FIGS. 17A to 17C, 18A to 18C and 19A to 19C.

The process starts with preparation of the p-type silicon substrate 201. Phosphorous is ion implanted into a surface portion of the p-type silicon substrate 201 assigned to the power field effect transistor at dosage of $5 \times 10^{12}$ cm$^{-2}$ at 150 KeV. After the ion-implantation, the phosphorous is activated through a heat treatment at 1200 degrees in centigrade for 8 hours. The ion-implanted phosphorous is diffused in the heat treatment, and forms the lightly doped n-type drain region 202. The lightly doped n-type impurity region 202 forms the p-n junction together with the p-type silicon substrate 201, and the bottom surface of the lightly doped n-type impurity region 202 is of the order of 6 microns deep.

The field oxide layer 203 is grown on the lightly doped n-type impurity region 202 in such a manner as to expose the surface portion of the lightly doped n-type impurity region 202 assigned to the heavily doped n-type drain contact region 216 to the gap formed therein. The gate forming region is partially overlapped with the field oxide layer 203.

Using the field oxide layer 203 as a thermal oxidation mask, the lightly doped n-type impurity region 202 is oxidized so that the gate oxide layer 204 is grown on the lightly doped n-type impurity region 202. The heavily doped n-type polysilicon is deposited over the entire surface of the resultant structure. Silicon oxide may be further deposited over the entire surface of the heavily doped n-type polysilicon layer.

A photo-resist etching mask (not shown) is prepared on the silicon oxide layer by using the photo-lithographic techniques. Using the photo-resist etching mask, the silicon oxide layer, the heavily doped n-type polysilicon layer and the gate oxide layer 204 are selectively etched so that the gate electrode 205 is left partially on the field oxide layer 203 partially on the gate oxide layer 204. The gate portions are locally constricted, and the trapezoidal dents take place in the gate portions. The lightly doped n-type impurity region 202 is exposed to the gaps between the gate portions of the gate electrode 205. The photo-resist etching mask is stripped off.

The exposed surface of the lightly doped n-type impurity region 202 and the exposed surface of the gate electrode 205 are thermally oxidized so as to be covered with silicon oxide layers of several nanometers thick.

Another photo-resist ion-implantation mask (not shown) is prepared on the resultant structure by using the photo-lithographic techniques. The photo-resist ion-implantation mask has an opening over the surface portion of the lightly doped n-type impurity region 202 assigned to the p-type impurity region 206. However, the surface portion assigned to the heavily doped n-type drain contact region 216 is covered with the photo-resist ion-implantation mask.

Using the photo-resist ion-implantation mask and the gate electrode 205 as an ion-implantation mask, boron is ion implanted into the exposed surface portion of the lightly doped n-type impurity region 202 at dosage of $10^{13}$ cm$^2$ in a self-aligned manner with the gate electrode 205. The photo-resist ion-implantation mask is stripped off, and the boron is activated through a heat treatment. The boron forms the p-type impurity region 206, and the p-n junction between the p-type impurity region 206 and the lightly doped n-type impurity region 202 is of the order of 1.2 microns deep.

Silicon nitride is deposited to 10 nanometers thick over the entire surface of the resultant structure by using a low-pressure chemical vapor deposition technique, and forms a silicon nitride layer 231. Subsequently, silicon oxide is deposited over the entire surface of the silicon nitride layer 231 through the low pressure chemical vapor deposition, and the silicon oxide layer is laminated on the silicon nitride layer 231. The silicon oxide layer is chemically mechanically polished, and a flat surface is created on the silicon oxide layer. The gap over the p-type impurity region 206 is buried with the silicon oxide layer, and the silicon oxide layer over the p-type impurity region 206 has the flat upper surface slightly higher than the upper surface of the gate electrode (or the remaining silicon oxide layer) on the field oxide layer 203.

Figure 17A:
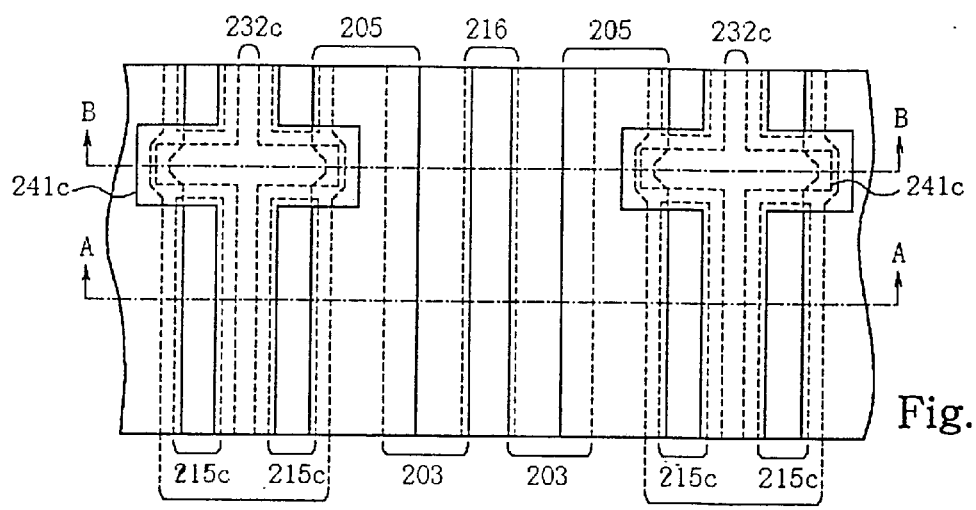
FIGS. 17A to 17C are plane views showing a process for fabricating the power field effect transistor shown in FIGS. 16A to 16C.

Subsequently, a photo-resist mask 241c is prepared on the silicon oxide layer through the photo-lithographic techniques. The surface portion assigned to the heavily doped p-type impurity region 217c and the projecting portions of the p-type impurity region 206 are covered with the photo-resist mask 241c. For this reason, the photo-resist mask 241c has straight portions and bulge portions as shown in FIG. 17A. The straight portions range from 1.5 microns to 1.8 microns in width, and the bulge portions measure 3.6 microns to 4.2 microns in the direction of the gate portions. The gate portions are partially covered with the photo-resist mask 241c by 0.6 micron along the longitudinal direction thereof. Using the photo-resist mask 241c, the silicon oxide layer is firstly subjected to an anisotropic etching. Namely, the silicon oxide layer is selectively etched away by using dry etchant containing $C_4F_8$ and CO, and the silicon oxide layer is patterned into a silicon oxide mask 232b. Subsequently, the silicon oxide layer is isotropically etched by using diluted hydrofluoric acid, and the remaining silicon oxide layer is reduced in width. Upon completion of the patterning step, a silicon oxide mask 232c is prepared on the p-type impurity region 206. The silicon oxide mask 232c is of the order of 0.5 micron to 1.2 microns in width beside the straight portions of the gate portions of the gate electrode 205. Thus, the surface portions assigned to the heavily doped n-type source regions 215c and the heavily doped n-type drain contact region 216 are exposed to the gaps between the gate portions of the gate electrode 205 and the silicon oxide mask 232c and the gap formed in the field oxide layer 203.

Figure 18A:
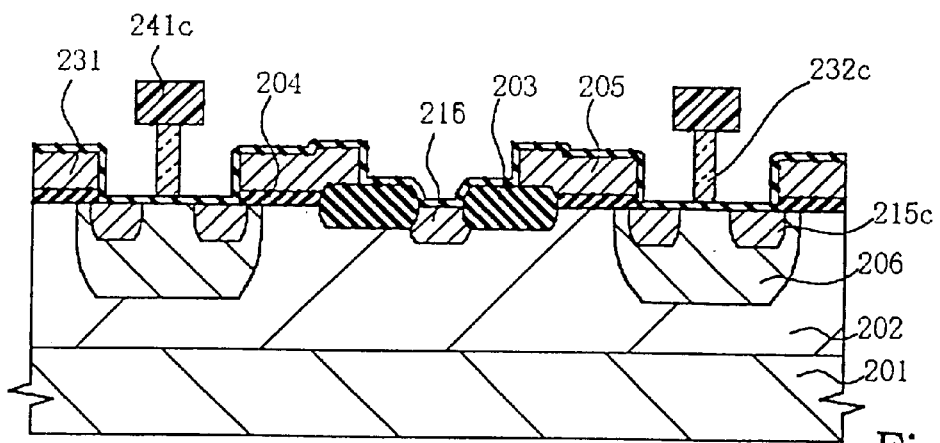
FIGS. 18A to 18C are cross sectional views taken along lines A—A of FIGS. 16A to 16C and showing the structures of the power field effect transistors at different steps.
Figure 19A:
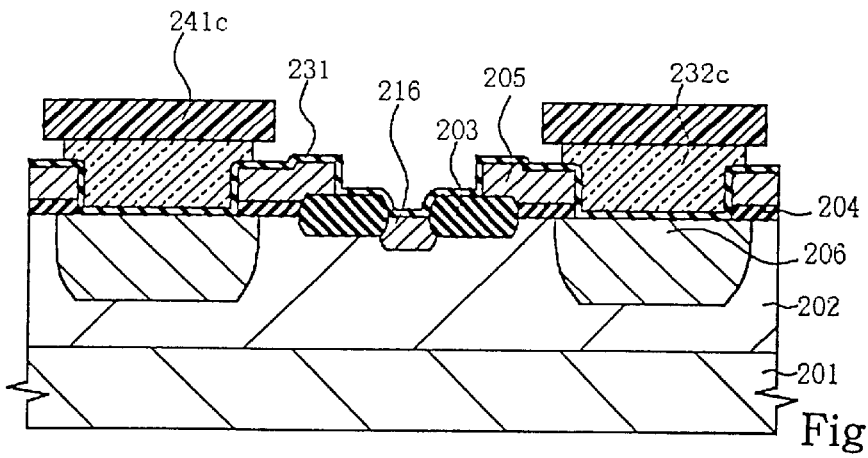
FIGS. 19A to 19C are cross sectional views taken along lines B—B of FIGS. 16A to 16C and showing the structures of the power field effect transistors at the different steps.

Using the photo-resist mask 241c on the silicon oxide mask 232c, arsenic is ion implanted into the surface portions at dosage of $1\times10^{16}$ cm$^{-2}$ at 300 to 350 KeV in a self-aligned manner with the gate electrode 205 and the field oxide layer 203. The photo-resist etching mask 241c is stripped off. The arsenic forms the heavily doped n-type drain contact region 216 and the heavily doped n-type source regions 215b as shown in FIGS. 17A, 18A and 19A. The heavily doped n-type drain contact region 216 is self-aligned with the field oxide layer 203, and the heavily doped n-type source regions 215c are self-aligned with the gate electrode 205. The heavily doped n-type drain contact region 216 and the heavily doped n-type source regions 215b are of the order of 0.3 micron deep, and the heavily doped n-type source regions 215b are disconnected at the projecting portions in the p-type impurity region 206.

Subsequently, a photo-resist mask 242c is prepared on the resultant structure by using the photo-lithographic techniques. The photo-resist mask 242c has openings over the projecting portions on both sides of the surface portion assigned to the heavily doped p-type impurity region 217c, and the silicon oxide mask 232b over the surface portion assigned to the heavily doped p-type impurity region 217c and the heavily doped n-type source regions 215c are covered with the photo-resist mask 242c. The openings measure at least 3.5 microns in the direction parallel to the gate portions of the gate electrode 205.

Figure 17B:
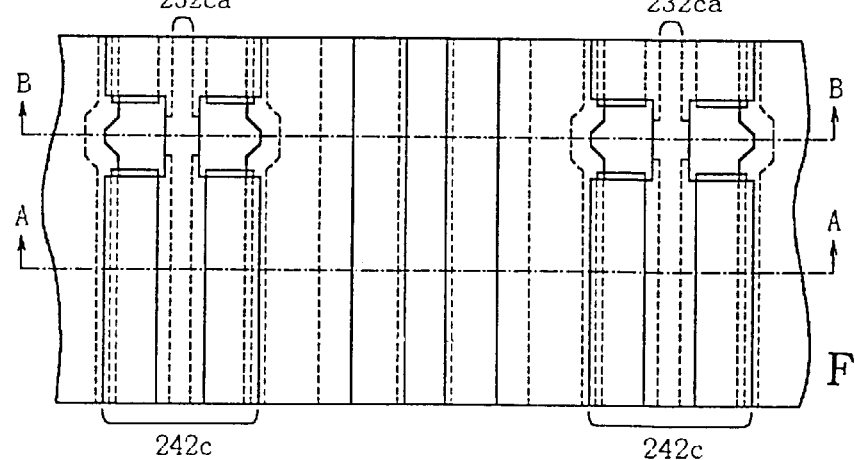
Figure 18B:
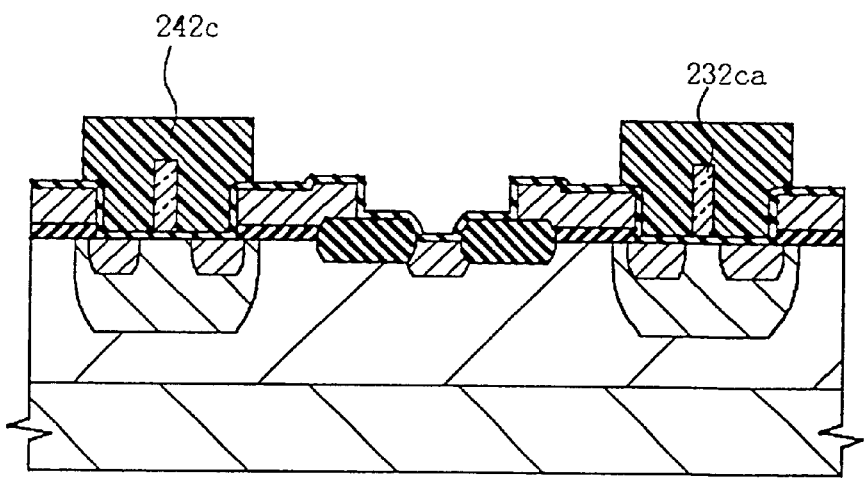
Figure 19B:
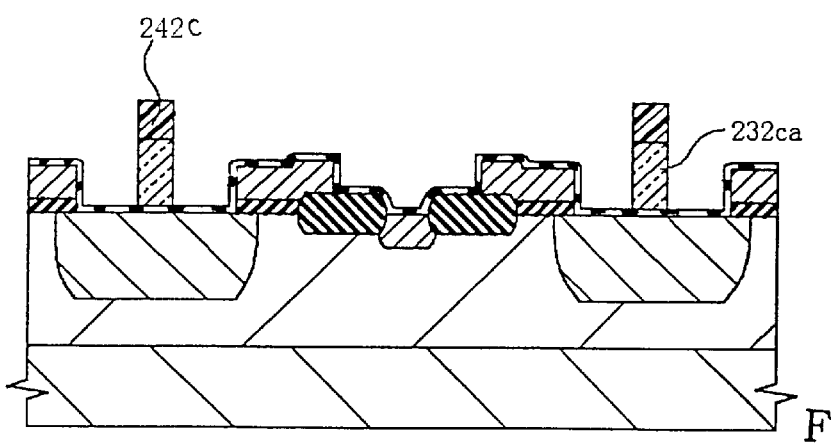

Using the photo-resist mask 242c, the silicon oxide mask 232c is partially etched away by using the unisotropic etching technique, and the silicon oxide mask 232c is formed into a silicon oxide mask 232ca as shown in FIGS. 17B, 18B and 19B. The photo-resist mask 242c is stripped off.

Subsequently, the entire surface of the resultant structure is covered with photo-resist, and the photo-resist layer is uniformly etched without any mask until the silicon oxide mask 232ca is exposed. Thus, the photo-resist ion-implantation mask 243c is formed from the photo-resist layer, and the heavily doped drain contact region 216, the heavily doped n-type source regions 215c and the p-type impurity region 206 between the heavily doped n-type source regions 215c are covered with the photo-resist ion-implantation mask 243c. Thus, the p-type impurity region 206 is partially covered with the photo-resist ion-implantation mask 243c and partially with the silicon oxide mask 232ca.

Subsequently, the silicon oxide mask 232ca is etched away by using an isotropic etching technique. Buffered hydrofluoric acid is, by way of example, used in the isotropic etching. When the silicon oxide mask 232ca is removed, the surface portion assigned to the heavily doped p-type impurity region 217c is exposed to the gap uncovered with the photo-resist ion-implantation mask 243c.

Figure 17C:
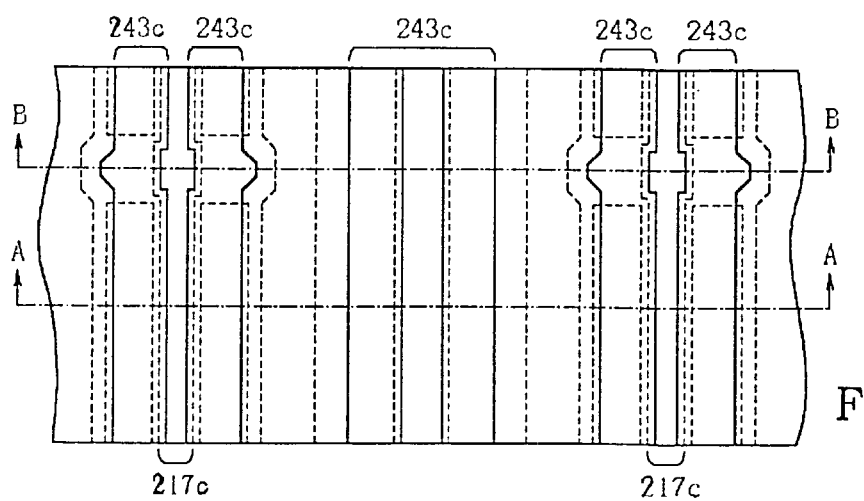
Figure 18C:
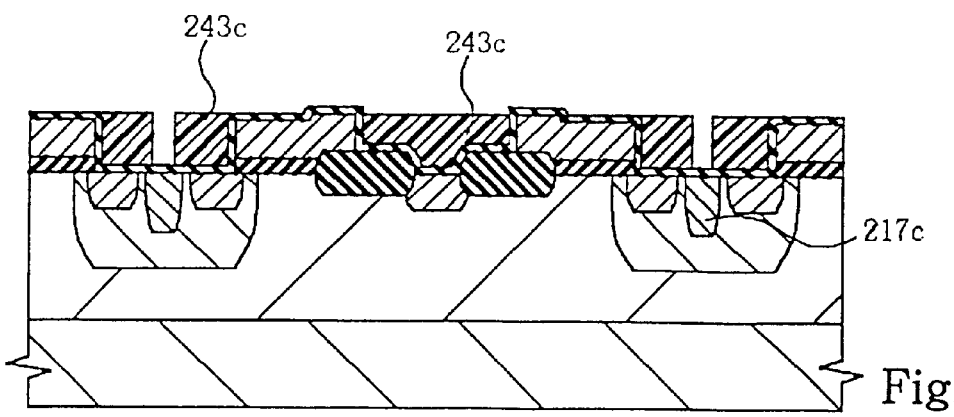
Figure 19C:
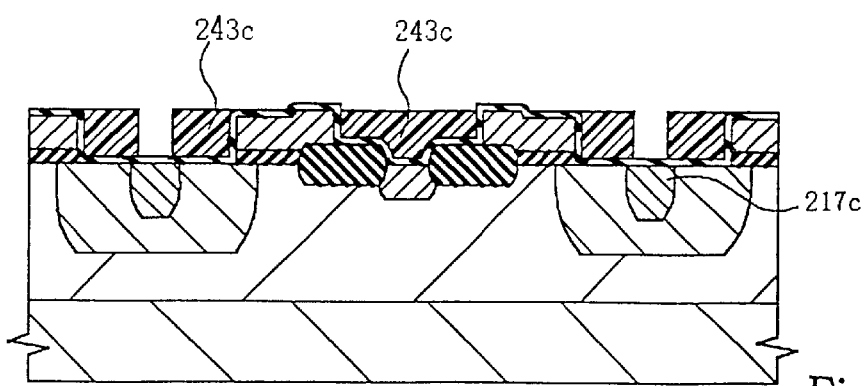

Using the photo-resist ion-implantation mask 243c, boron is ion implanted into the exposed surface portion at dosage of the order of $10^{15}$ cm$^{-2}$ at 150 to 180 KeV. The ion-implanted boron forms the heavily doped p-type impurity region 217c, but has not been activated, yet. The photo-resist ion-implantation mask 243b is stripped off. The resultant structure is shown in FIGS. 17C, 18C and 19C.

The silicon nitride layer 231 is etched away by using an isotropic etching technique. Hot phosphoric acid may be used in the isotropic etching. The silicon oxide layer was thermally grown before the deposition of the silicon nitride layer. The silicon oxide is of the order of several nanometers thick, and is etched away by using diluted hydrofluoric acid. The resultant structure is subjected to a rapid anneal, and the n-type dopant impurity and the p-type dopant impurity are concurrently activated so as to form the heavily doped n-type drain contact region 216, the heavily doped n-type source regions 215c and the heavily doped p-type impurity region 217c.

Insulating material is deposited over the entire surface of the resultant structure, and forms the inter-layered insulating layer 221. A photo-resist etching mask is prepared on the inter-layered insulating layer 221 by using the photo-lithographic techniques, and has openings over the heavily doped n-type drain contact region 216 and the heavily doped n-type source regions 215b. The inter-layered insulating layer 221 is selectively etched away so as to form the drain contact holes 224 and the source contact holes 223. The photo-resist etching mask is stripped off.

Conductive material is deposited over the entire surface of the resultant structure. The source contact holes 223 and the drain contact holes 224 are buried with the conductive material, and swells into a conductive layer on the inter-layered insulating layer 221. A photo-resist etching mask is prepared on the conductive layer by using the photo-lithographic techniques, and the conductive layer is selectively etched away. When the etching is finished, the source electrode 225 and the drain electrode 226 are left on the inter-layered insulating layer 221, and are held in contact through the source contact holes 223 and the drain contact holes 224 with the heavily doped n-type drain contact region 216 and the heavily doped n-type source regions 215a, respectively.

The power field effect transistor implementing the sixth embodiment achieves all the advantages of the fourth embodiment. The power field effect transistor implementing the sixth embodiment exhibits the withstanding capability further improved rather than the fourth and fifth embodiments by virtue of the heavily doped p-type impurity region 217c spaced from the heavily doped n-type source regions 215c.

As will be appreciated from the foregoing description, the power field effect transistor according to the present invention has a portion where electric field is concentrated, and breakdown current is guided to the current paths between the source regions. The breakdown current smoothly flows, and the emitter-base junction of a parasitic bipolar transistor is not strongly biased. For this reason, the parasitic bipolar transistor is less liable to turn on, and the power field effect transistor is improved in the withstanding capability against the excess voltage.

Although particular embodiments of the present invention have been shown and described, it will be apparent to those skilled in the art that various changes and modifications may be made without departing from the spirit and scope of the present invention.

The second embodiment may be combined with the third embodiment. In this instance, the field oxide layer is locally constricted as similar to the gate oxide layer 103b, and, accordingly, the heavily doped n-type drain contact region locally projects into the lightly doped n-type drain region 102. Moreover, the gate electrode is locally constricted as similar to the gate electrode 105c, and, accordingly, the p-type impurity region locally projects. When the excess voltage is applied to the drain electrode, the electric field is strongly concentrated, and the withstanding capability is further improved.

The first, second and third embodiments are fabricated on the p-type silicon substrate, and are categorized in the n-channel type LDMOS transistor. However, another power field effect transistor may be fabricated on an n-type silicon substrate, and a p-channel is induced in the n-type channel forming region. The substrate may be formed of another kind of semiconductor. The gate electrode 105a to 105c may be formed of another kind of conductive material such as, for example, refractory metal silicide. The parameters of the first to third embodiments may be modifiable.

The process for the fourth embodiment may be used for the power field effect transistors implementing the first and second embodiments. The channel conductivity type may be p-type, and the silicon substrate 201 may be formed of another kind of semiconductor. In the process for the fourth embodiment, the heavily doped n-type polysilicon is deposited. However, another kind of conductive material such as, for example, refractory metal silicide may be used for the gate electrode 205. The parameters for the fourth embodiment are changeable.

The changes for the fourth embodiment are applicable to the fifth embodiment and the sixth embodiment.

What is claimed is:

1. A semiconductor device comprising a field effect transistor fabricated on a substrate, said field effect transistor including
    a drain layer formed on said substrate and doped with a first dopant impurity for imparting a first conductivity type thereto,
    a gate insulating layer formed on a first surface portion of said drain layer,
    a gate electrode formed on said gate insulating layer and having at least one gate portion elongated in a first direction,
    a drain contact region doped with said first dopant impurity heavier than said drain layer for imparting said first conductivity type thereto and having at least one drain contact sub-region formed in a second surface portion of said drain layer contiguous to one side of said first surface portion and elongated in said first direction,
    a channel forming region doped with a second dopant impurity for imparting a second conductivity type opposite to said first conductivity type thereto and formed in a third surface portion of said drain layer contiguous to the other side of said first surface portion and elongated in said first direction,
    an impurity region formed in said channel forming region and doped with said second dopant impurity heavier than said channel forming region,
    plural source regions doped with said first dopant impurity, formed in said channel forming region between said impurity region and said first surface portion in a self-aligned manner with said gate electrode and spaced from one another in said first direction,
    a drain electrode held in contact with said drain contact region, and
    a source electrode held in contact with said plural source regions and said impurity region, wherein at least one of said drain contact region and said channel forming region has a deformed portion directed to the gap between said plural source regions, and the distance between said drain contact region and said channel forming region is measured in a second direction perpendicular to said first direction so as to be different between said deformed portion and a remaining portion of said at least one of said drain contact region and said channel forming region.

2. The semiconductor device as set forth in claim 1, in which said plural source regions are spaced from one another at more than one gap, and said deformed portion has more than one deformed sub-portions respectively directed to said more than one gap.

3. The semiconductor device as set forth in claim 1, in which said deformed portion is spaced from said other of said drain contact region and said channel forming region wider than said remaining portion is.

4. The semiconductor device as set forth in claim 3, in which said channel forming region has a constricted portion serving as said deformed portion.

5. The semiconductor device as set forth in claim 4, in which said at least one gate portion has a projecting portion over said constricted portion of said channel forming region.

6. The semiconductor device as set forth in claim 5, in which said projecting portion has a straight side surface closer to said drain contact region and a curved side surface closer to said channel forming region.

7. The semiconductor device as set forth in claim 6, in which said plural source regions are self-aligned with said curved side surface of said projecting line.

8. The semiconductor device as set forth in claim 3, in which said first surface portion of said drain layer has a sub-portion closer to said second surface portion than a remaining portion thereof, and said sub-portion is covered with a field oxide layer.

9. The semiconductor device as set forth in claim 8, in which said drain contact region is self-aligned with said field oxide layer.

10. The semiconductor device as set forth in claim 1, in which said deformed portion is formed in said drain contact region, and said at least one gate portion has side surfaces substantially in parallel to said first direction.

11. The semiconductor device as set forth in claim 10, in which said deformed portion of said drain contact region has a side surface projecting in said second direction so that the distance between the side surface of said at least one gate portion and said side surface of said deformed portion is less than the distance between the side surface of said at least one gate portion and the side surface of a remaining portion of said drain contact region.

12. The semiconductor device as set forth in claim 10, in which one of said side surfaces of said at least one gate portion is self-aligned with said plural source regions.

13. The semiconductor device as set forth in claim 10, in which said gate electrode is partially laminated on a field oxide layer formed on a sub-portion of said first surface portion closer to said drain contact region than a remaining sub-portion of said first surface portion.

14. The semiconductor device as set forth in claim 13, in which said drain contact region is self-aligned with said field oxide layer.

15. The semiconductor device as set forth in claim 1, in which said deformed portion is spaced from said other of said drain contact region and said channel forming region narrower than said remaining portion is.

16. The semiconductor device as set forth inn claim 15, in which said channel forming region has a bulge portion projecting toward said drain contact region in said second direction and serving as said deformed portion.

17. The semiconductor device as set forth in claim 16, in which said gate electrode has a constricted portion over said bulge portion.

18. The semiconductor device as set forth in claim 17, in which said constricted portion has a side surface depressed in said second direction and another side surface substantially straight in said first direction.

19. The semiconductor device as set forth in claim 15, in which said at least one gate portion is partially laminated on a field oxide layer formed on a sub-portion of said first surface portion closer to said drain contact region than a remaining portion of said first surface portion.

20. The semiconductor device as set forth in claim 19, in which said drain contact region is self-aligned with said field oxide layer.

21. The semiconductor device as set forth in claim 16, in which said impurity region has a bulge portion nested in said bulge portion of said channel forming region and projecting toward said drain contact region.

22. The semiconductor device as set forth in claim 21, in which said impurity region has remaining portions substantially self-aligned with said plural source regions.

23. The semiconductor device as set forth in claim 21, in which said plural source regions are spaced from said impurity region in said second direction.

24. The semiconductor device as set forth in claim 21, in which said at least one gate portion is partially laminated on a field oxide layer formed on a sub-portion of said first surface portion closer to said drain contact region than a remaining portion of said first surface portion.

25. The semiconductor device as set forth in claim 24, in which said drain contact region is self-aligned with said field oxide layer.

* * * * *